United States Patent [19]
Saito et al.

[11] Patent Number: 5,124,272
[45] Date of Patent: Jun. 23, 1992

[54] METHOD OF PRODUCING FIELD EFFECT TRANSISTOR

[75] Inventors: Naoto Saito; Kenji Aoki; Tadao Akamine; Yoshikazu Kojima; Kunihiro Takahashi; Masahiko Kinbara, all of Tokyo, Japan

[73] Assignee: Seiko Instruments, Inc., Tokyo, Japan

[21] Appl. No.: 565,960

[22] Filed: Aug. 13, 1990

[30] Foreign Application Priority Data

| July 18, 1989 [JP] | Japan | 1-86680 |
| July 18, 1989 [JP] | Japan | 1-86682 |
| Aug. 11, 1989 [JP] | Japan | 1-209287 |
| Aug. 11, 1989 [JP] | Japan | 1-209288 |
| Aug. 11, 1989 [JP] | Japan | 1-209289 |
| Aug. 11, 1989 [JP] | Japan | 1-209291 |
| Aug. 18, 1989 [JP] | Japan | 1-213192 |
| Sep. 6, 1989 [JP] | Japan | 1-231276 |
| Sep. 6, 1989 [JP] | Japan | 1-231277 |
| Sep. 6, 1989 [JP] | Japan | 1-231279 |
| Sep. 6, 1989 [JP] | Japan | 1-231280 |
| Dec. 6, 1989 [JP] | Japan | 1-318557 |
| Dec. 6, 1989 [JP] | Japan | 1-318558 |

[51] Int. Cl.$^5$ .................... H01L 21/265
[52] U.S. Cl. .................... 437/41; 437/44; 437/45; 437/192; 437/946
[58] Field of Search .............. 437/41, 40, 44, 192, 437/45, 913, 946

[56] References Cited

U.S. PATENT DOCUMENTS

| 4,475,279 | 10/1984 | Gahle | 437/41 |
| 4,503,598 | 3/1985 | Vora et al. | 437/41 |
| 4,677,736 | 7/1987 | Brown | 437/41 |
| 4,789,644 | 12/1988 | Meda | 437/41 |
| 4,791,074 | 12/1988 | Tsunashima et al. | |
| 4,855,258 | 8/1989 | Allman et al. | |
| 4,868,135 | 9/1989 | Ogura et al. | 437/41 |
| 4,912,061 | 3/1990 | Nasr | 437/44 |
| 4,931,411 | 6/1990 | Tigelaar et al. | 437/192 |
| 4,933,994 | 6/1990 | Orban | 437/44 |

FOREIGN PATENT DOCUMENTS

| 0268941 | 11/1987 | European Pat. Off. |
| 90114790 | 12/1990 | European Pat. Off. |
| 63-166220 | 7/1988 | Japan |
| 83/04342 | 12/1983 | PCT Int'l Appl. |

OTHER PUBLICATIONS

Nikkei High Tech Report, No. 7, 13 Feb. 1989.
Research Disclosure No. 303, Jul. 1989, p. 496.
Journal of Applied Physics, vol. 65, No. 11, Jun. 1989, pp. 4435–4437.
1988 Symposium on VLSI Technology, May 10–13, 1988, pp. 69–70.
*Journal of Applied Physics*, vol. 59, No. 12, Jun. 1986, pp. 4032–4037, American Institute of Physics, M. L. Yu, et al., "Doping reaction of $PH_3$ and $B_2H_6$ with Si(100)".
*IEEE Electron Device Letters*, vol. 11, No. 3, Mar. 1990, pp. 105–106, J.-I. Nishizawa, et al., "Simple-structured PMOSFET fabricated using molecular layer doping".

Primary Examiner—Brian E. Hearn
Assistant Examiner—Kevin M. Picardat
Attorney, Agent, or Firm—Spensley, Horn, Jubas & Lubitz

[57] ABSTRACT

An impurity adsorption layer is selectively formed from a gas containing an impurity on a semiconductor surface. Solid-phase diffusion of the impurity is effected from the impurity adsorption layer into the semiconductor surface to form a source region and a drain region having a sufficiently small resistivity and an ultra-shallow PN junction depth, thereby producing a metal-insulator semiconductor field-effect-transistor featuring fast operating speed and reduced dimensions.

20 Claims, 31 Drawing Sheets

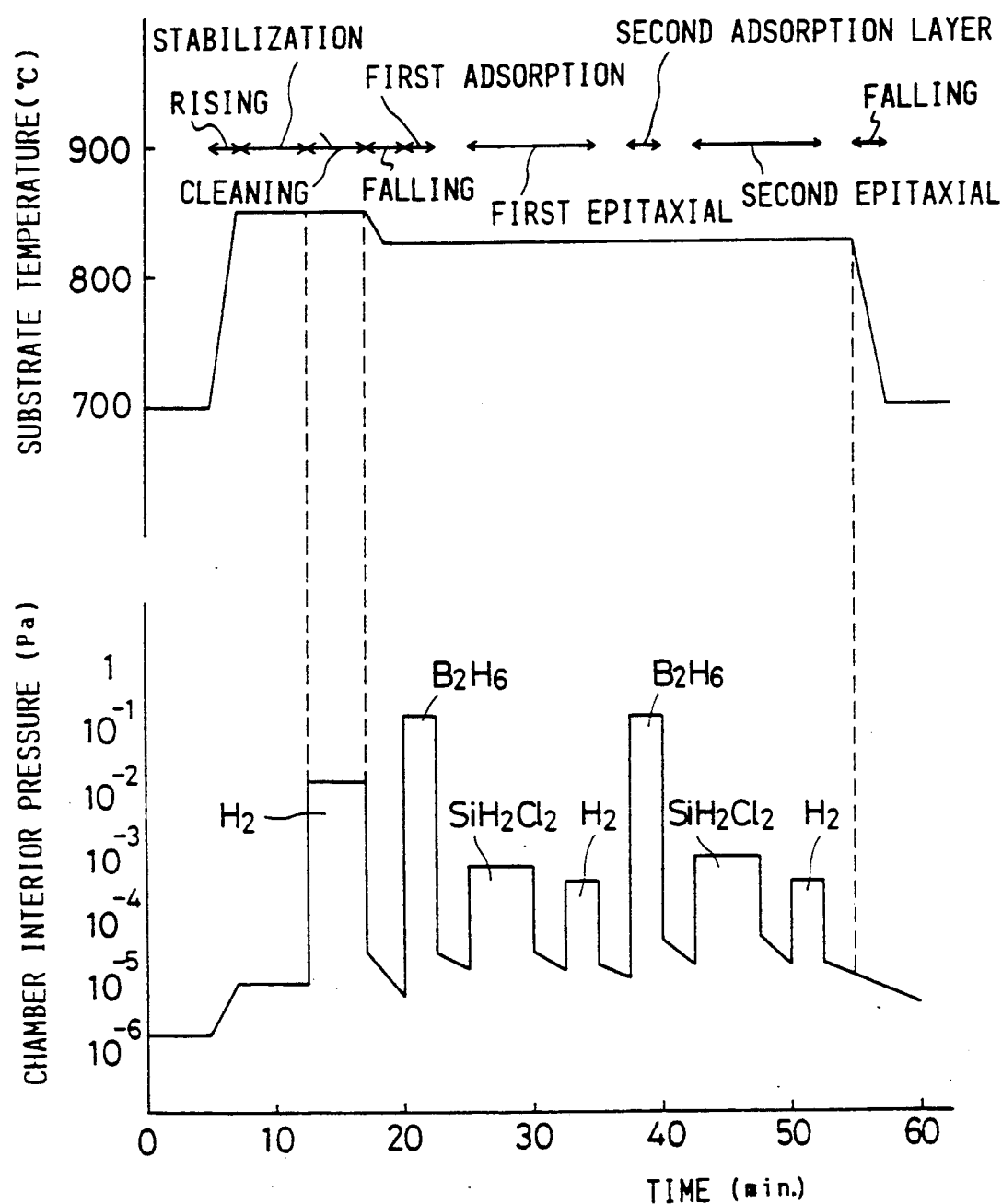

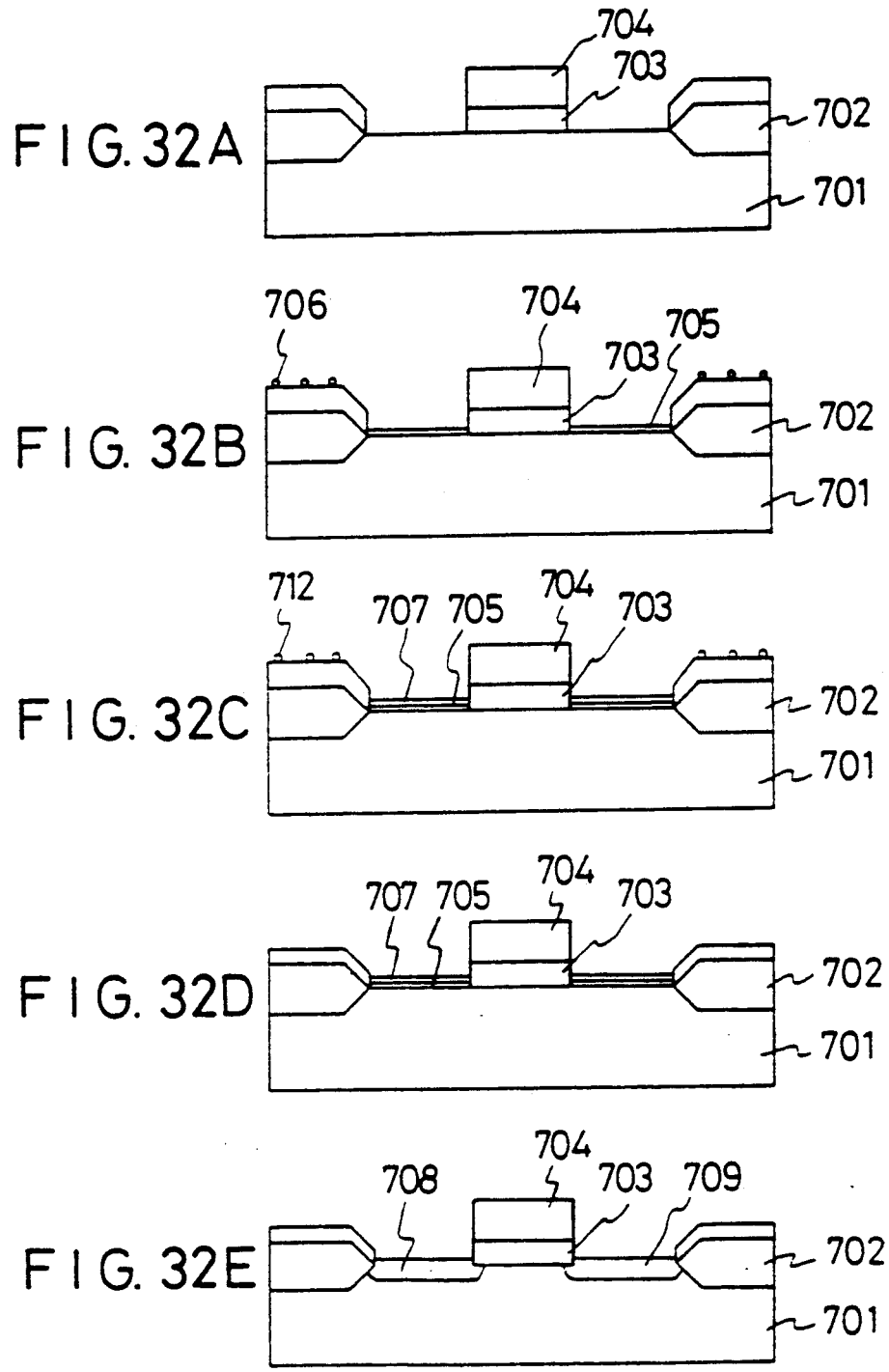

METHOD OF PRODUCING FIELD EFFECT TRANSISTOR

BACKGROUND OF THE INVENTION

1. Field of the Invention

The present invention relates to methods for producing semiconductor devices, and more specifically relates to methods for producing a metal-insulator-semiconductor field effect transistor (hereinafter, "MISFET") utilized generally in electronic instruments such as computers.

2. Prior Art

There are known MISFETs of the type composed of a gate electrode formed on a semiconductor region above a gate insulating film. In making this type of MISFET, conventionally, a field oxide film is formed on a surface of the semiconductor substrate by selective oxidation, and thereafter a gate oxide film and a polysilicon film are deposited sequentially. Then, the polysilicon film is patterned into a gate electrode, and a resist is coated over the field oxide film. Thereafter, an impurity such as P type boron is doped into a surface of the N type silicon substrate through the gate oxide film by ion implantation, using the patterned gate electrode as a mask so as to form a P+ type source region and a P+ type drain region.

However, the ion implantation method is conventionally used for forming the source and drain regions, thereby causing the following drawbacks:
1. The impurity is vertically injected in a Gausian distribution, hence a shallow impurity-doped region cannot be formed controllably.
2. Accelerated ions of high energy bombard the substrate surface through the gate oxide film, thereby destroying the gate oxide film when its thickness is relatively small.
3. Crystal defects may be caused on the semiconductor substrate surface due to ion bombardment. In view of the above noted drawbacks, it has proven difficult to produce a semiconductor device having a fast signal transfer speed and an ultra-small size.

SUMMARY OF THE INVENTION

An object of the present invention is to provide a new method of impurity doping so as to eliminate the above noted drawbacks of the prior art.

According to the invention, an impurity adsorption layer is formed on a semiconductor substrate surface, and then source and drain regions are formed by solid phase-diffusion from a diffusion source composed of the impurity adsorption layer. By such method, there can be produced an improved semiconductor device formed with ultra-shallow source and drain regions and therefore having a fast operating speed and a very small size.

BRIEF DESCRIPTION OF THE DRAWINGS

FIG. 30 is a process flow diagram showing the process of impurity-doped layer formation in the eighth embodiment.

FIGS. 32A-32E are step sequence diagrams showing modification of the eighth embodiment.

FIGS. 34A-34F are step sequence diagrams showing a modification of the ninth embodiment.

DESCRIPTION OF THE PREFERRED EMBODIMENTS

Hereinafter, embodiments of the present invention for producing semiconductor devices will be described with reference to the drawings. The semiconductor device can be formed on a surface of a semiconductor region which may be composed of a semiconductor substrate, a semiconductor well formed in a semiconductor substrate surface or a semiconductor thin film formed on an insulating film.

FIRST EMBODIMENT

Figure 1A:
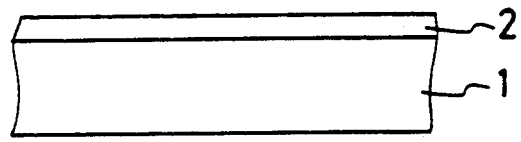
FIGS. 1A-1E are step sequence diagrams showing a first embodiment of the inventive method for producing a semiconductor device.
Figure 1B:
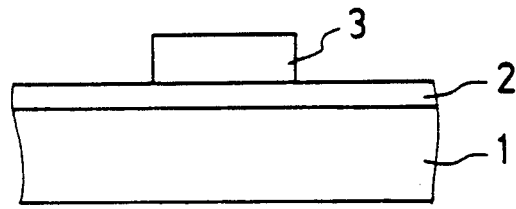
Figure 1C:
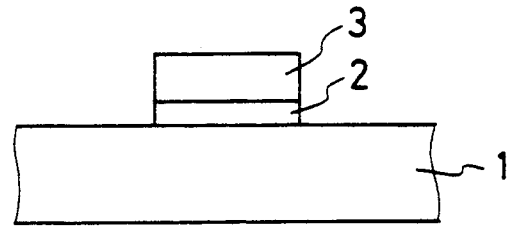
Figure 1D:
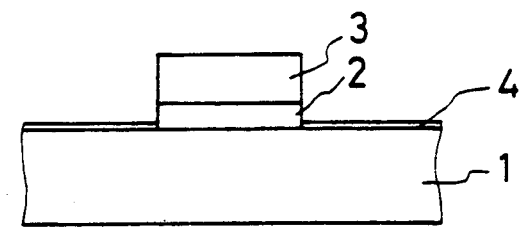
Figure 1E:
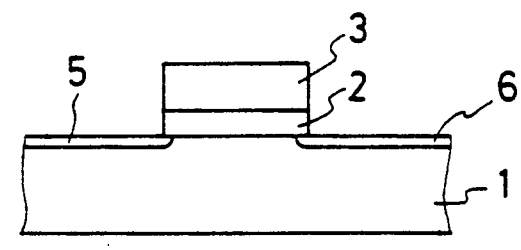

FIGS. 1A-1E show a first embodiment of the invention in which an N type silicon substrate 1 is utilized to provide a semiconductor region. In the FIG. 1A step, a gate oxide film 2 is formed on the N type silicon substrate 1. Next in the FIG. 1B step, a gate electrode 3 is formed on the gate oxide film 2. Then in the FIG. 1C step, the gate oxide film 2 is removed, using gate electrode 3 as a mask, to expose a surface of the N type silicon substrate 1. Subsequently in the FIG. 1D step, a boron adsorption layer 4 is formed on the exposed surface of N type silicon substrate 1 by exposing that surface to diborane gas. While forming the adsorption layer containing boron atoms or boron compounds in the FIG. 1D step, diffusion of boron concurrently progresses into the substrate bulk, or body, to a certain degree depending on substrate temperature during application of the source diborane gas. Hereinafter, in this and following embodiments, the FIG. 1D step is simply called the step of forming an impurity adsorption layer though the diffusion concurrently occurs. Further in the FIG. 1E step, thermal treatment is carried out at 800° C.-900° C. to form a P+ type source region 5 and a P+ type drain region 6 to thereby produce an N type metal-oxide-semiconductor (hereinafter, MOS) transistor. Boron can be doped to a high density into the substrate surface to form the P+ type source and P+ type drain regions by increasing the charging pressure of diborane ($B_2H_2$) gas or prolonging the charging time interval when forming the boron adsorption layer on the preceding layer. During the step depicted in FIG. 1E, boron is subjected to phase diffusion into substrate 1 and is activated. Substantially all of the boron in layer 4 of FIG. 1D is diffused into substrate 1.

Figure 2:
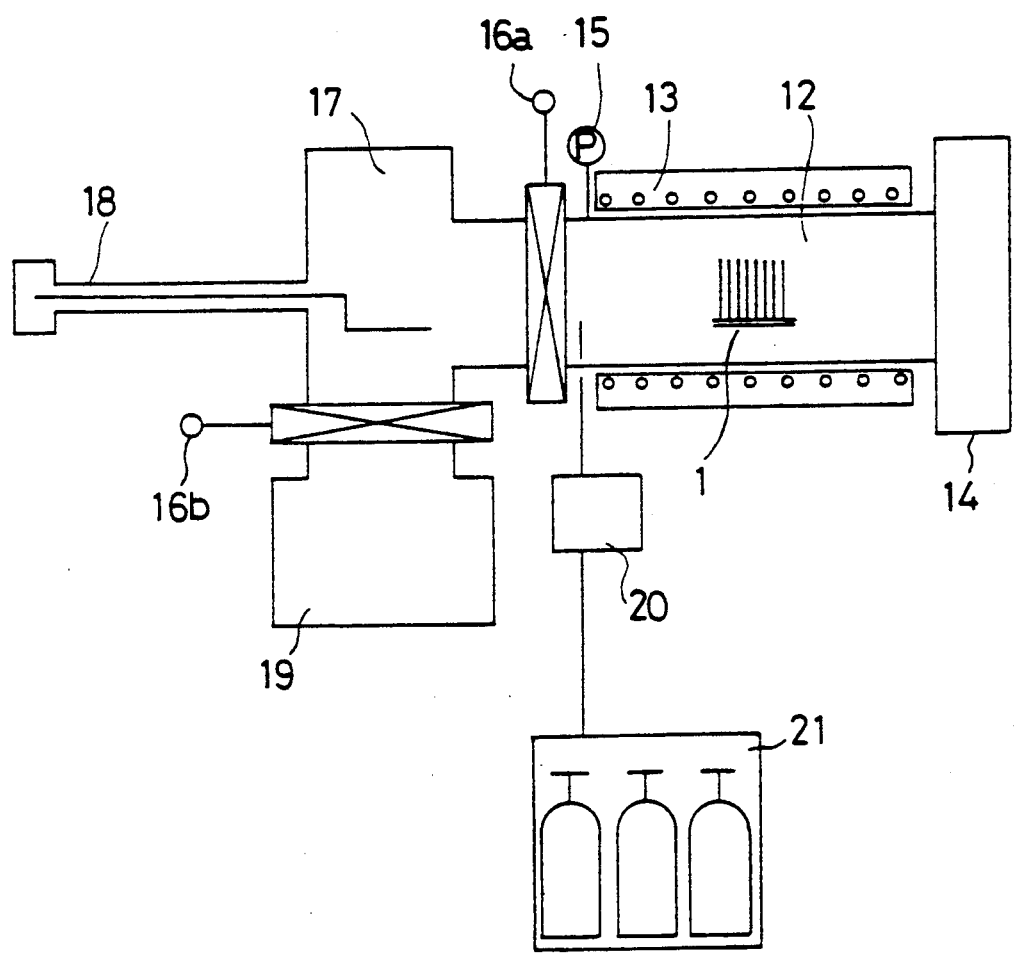
FIG. 2 is a schematic diagram showing a chamber apparatus utilized to carry out impurity doping into source and drain regions by the inventive method of producing a semiconductor device.

FIG. 2 is a schematic diagram of an apparatus used in practicing sequentially the significant steps of cleaning, adsorption and diffusion according to the invention. In FIG. 2, a silicon substrate 1 coated with an inert film is set in the center of a chamber 12 made cf quartz. The temperature of substrate 1 is maintained at a given value by controlling a heating system 13 utilizing infrared ray lamp heating or resistance heating. The interior of chamber 12 is evacuated to a high vacuum degree by means of a high vacuum evacuation system 14 comprised of plural pumps including a main vacuum pump in the form of a turbo-molecular pump. The degree of vacuum inside the chamber 12 is monitored by a pressure gage 15. The silicon substrate 1 is transported by means of a transportation mechanism 18 between the chamber 12 and a load chamber 17 which is connected to the main chamber 12 through a gate valve 16a which is held open during the transportation. The load chamber 17 is normally evacuated at a high vacuum by means of a load chamber evacuation system 19 while opening another gate valve 6b other than during the course of loading of the silicon substrate 1 into the load chamber 17 and during the transportation thereof. A gas supply source 21 introduces various gases into the chamber 12. A gas charging control system 20 is used to control the charging amount of gas and the charging mode etc.

Figure 3:
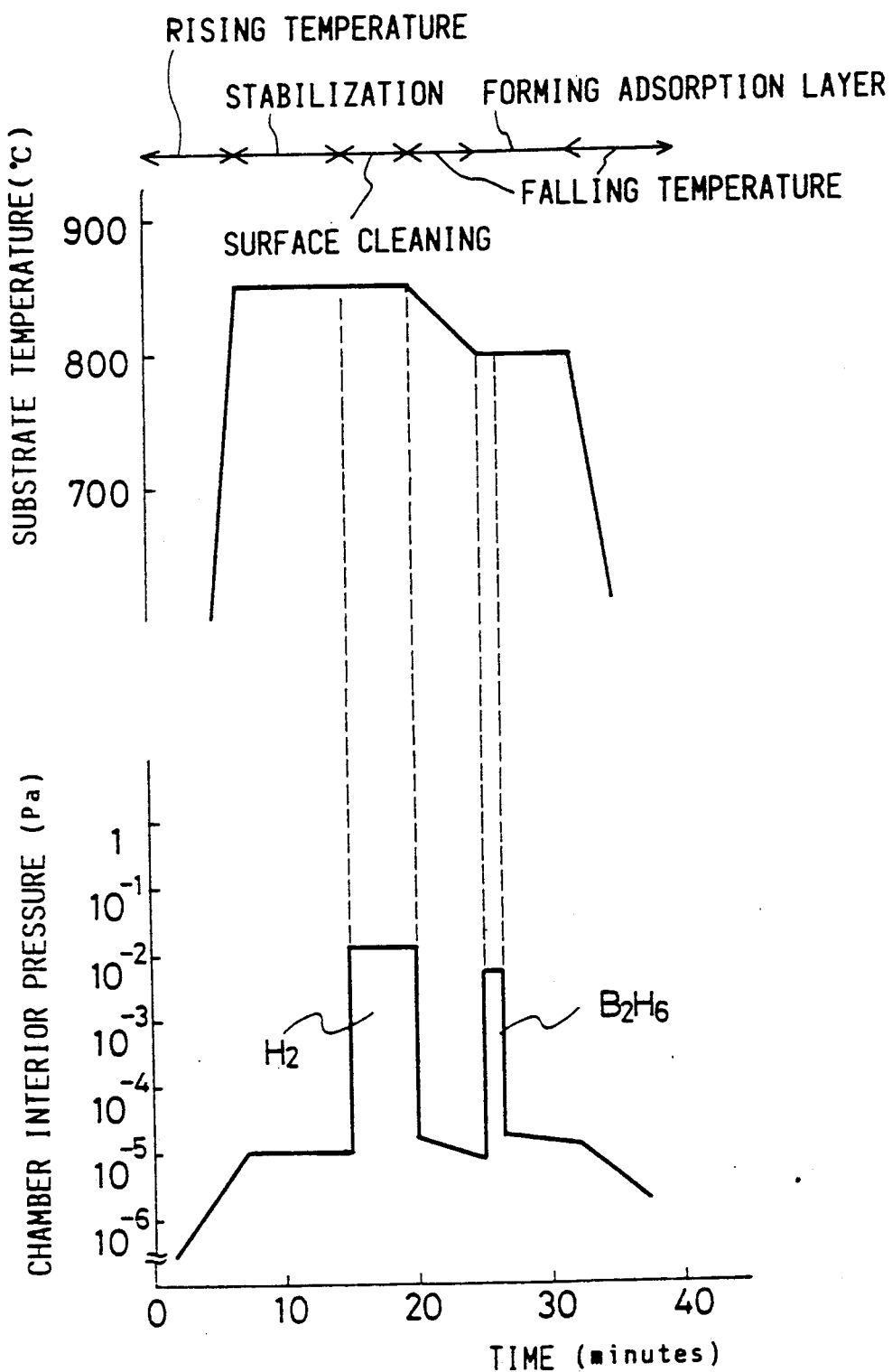
FIG. 3 is a process flow diagram showing the process of impurity adsorption layer formation in the first embodiment.

FIG. 3 is a process flow chart depicting the steps of adsorbing and doping the impurity to form the source region 5 and drain region 6. Firstly, the semiconductor substrate is heated at 850° C. or more in a vacuum of about less than $10^{-4}$ Pa. Next, after stabilizing the ambient conditions for several minutes, hydrogen gas is introduced into the chamber at a pressure of $10^{-2}$ Pa. An inert film in the form of a less than about 30Å thick natural oxide film is removed by the hydrogen from the surface of silicon substrate 1 to thereby clean the substrate surface. Consequently, activated silicon atoms are exposed on the substrate surface. Such cleaning process can be effected in other ways, such as by introducing HF gas to remove the natural oxide film, or reverse sputtering of Ar may be carried out to remove the inert film. Further, pretreatment may be carried out to wash the substrate with diluted HF solution so as to suppress the formation of a natural oxide film, thereby advantageously eliminating need for the step of removing the same. Lastly, a compound gas containing boron, such as diborane gas, is applied to the cleaned surface of the substrate for 100 seconds at about $10^{-2}$ Pa of the charging pressure while maintaining the substrate temperature at about 825° C. to thereby form the boron adsorption layer on the silicon substrate 1.

Figure 4:
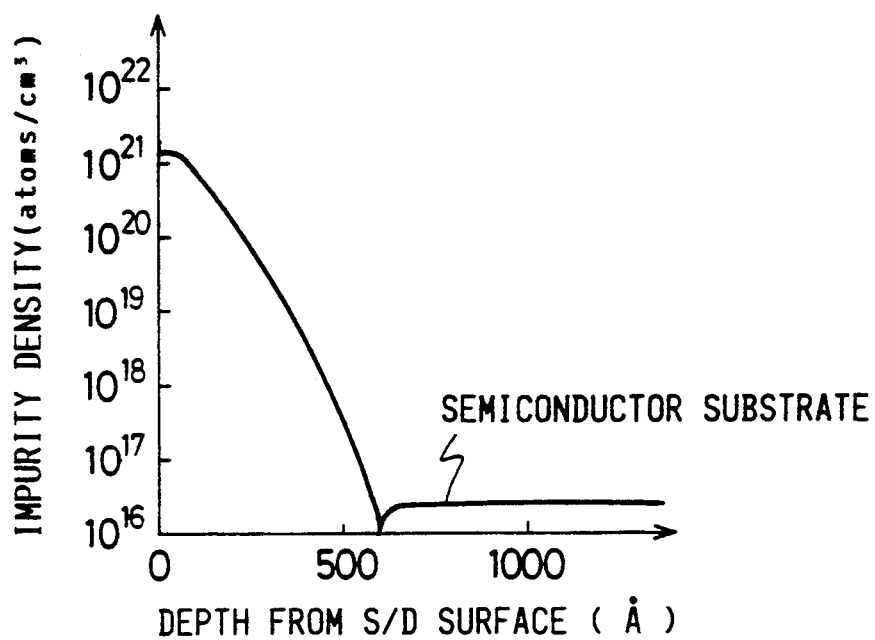
FIG. 4 is a graph showing the depth distribution of the impurity atoms measured after the formation of an impurity adsorption layer in the first embodiment.

FIG. 4 is a depth profile of the boron density in the silicon substrate, obtained according to the FIG. 3 process and measured after the formation of the boron adsorption layer. The origin of the abscissa is at the surface of the source and drain regions, which corresponds to the original surface of substrate 1. Boron density peak and boron dose can be controlled by changing the charging pressure of diborane gas and charging time interval thereof during the formation of the boron adsorption layer.

Figure 5:
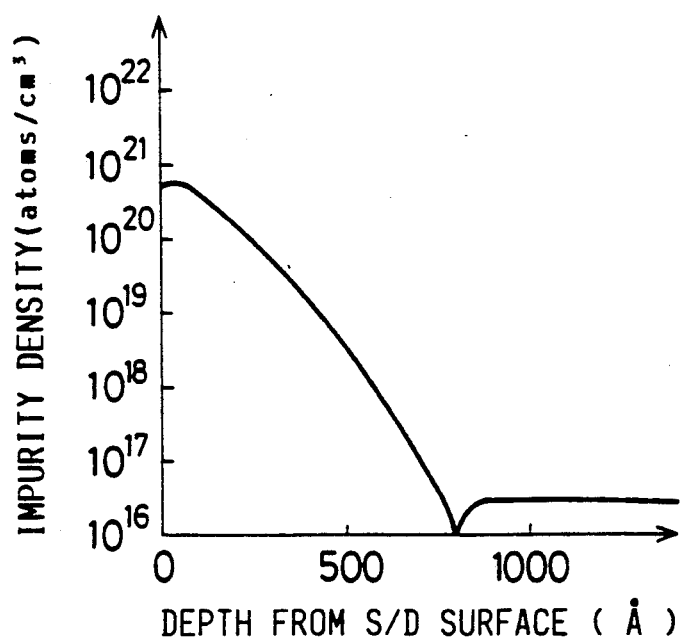
FIG. 5 is a graph showing another depth distribution of the impurity atoms measured after thermal treatment in the first embodiment.

FIG. 5 is another depth profile of the boron density in the substrate, measured after effecting solid-phase diffusion of boron into the substrate from a diffusion source constituted by the boron adsorption layer so as to activate boron by heating at 850° C. for 30 minutes. As shown, by thermal treatment at 800° C.–900° C., resistivity can be reduced in the source region and drain region.

According to the inventive method of producing the semiconductor device, the source region 5 and the drain region 6 are formed in a shallow portion from the surface of the silicon substrate 1 so as to reduce the size of the MOS transistor. In addition, the impurity region is formed by chemical adsorption to thereby avoid damage or defects in the transistor.

In the first embodiment, boron is utilized to form a P type MOS transistor. Boron has a diffusion coefficient greater than that of N type arsenic so that boron is quite suitable for the present invention. However, an N type impurity such as antimony can be also utilized to form source and drain regions to produce an N type MOS transistor. In addition, the semiconductor substrate may be composed of germanium instead of silicon. Further, the gate insulating film may be composed of materials other than silicon oxide.

SECOND EMBODIMENT

FIGS. 6A-6G show a second embodiment of the invention in which impurity adsorption and diffusion are repeatedly carried out on the semiconductor substrate surface to form the source region and drain region. Such method can permit optimum control of the junction depth of the source and drain regions and the impurity density in the surface of the substrate in an optimum manner.

Figure 6A:
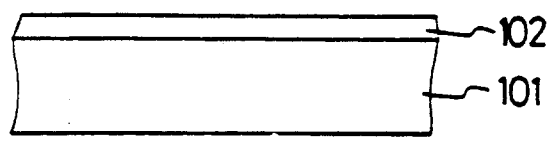
FIG. 6A-6G are step sequence diagrams showing a second embodiment of the inventive method for producing a MISFET.
Figure 6B:
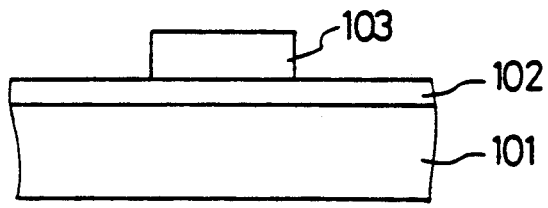
Figure 6C:
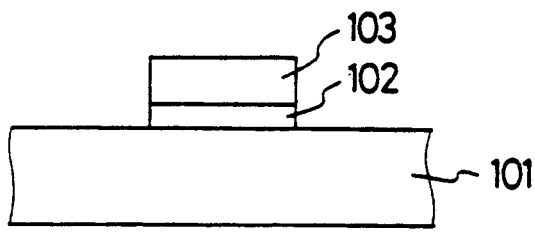
Figure 6D:
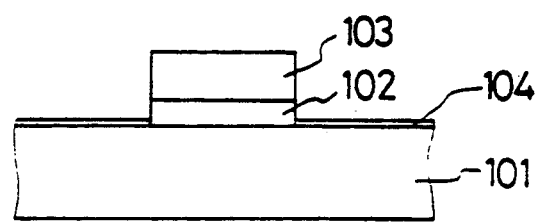
Figure 6E:
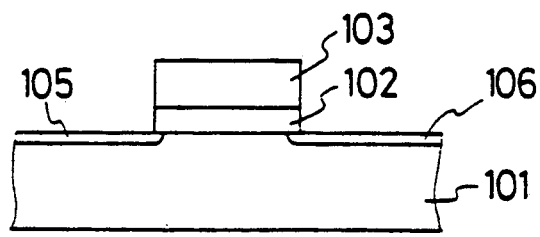

In the FIG. 6A step, a gate oxide film 102 is formed on the N type silicon substrate 101. Next in the FIG. 6B step, a gate electrode 103 is formed on the gate oxide film 102. Then in the FIG. 6C step, the gate oxide film 102 is removed, using gate electrode 103 as a mask, to expose a surface of the N type silicon substrate 101. Subsequently in the FIG. 6D step, a first boron adsorption layer 104 is formed on the exposed surface of N type silicon substrate 101. Then, in the FIG. 6E step, diffusion and activation of boron are effected by thermal treatment to initially form source region 105 and drain region 106.

Figure 6F:
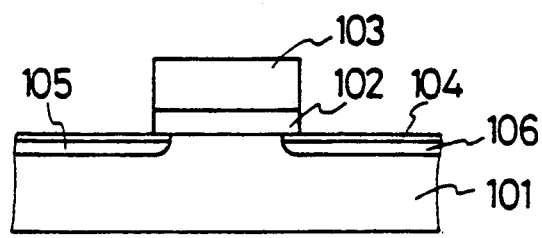
Figure 6G:
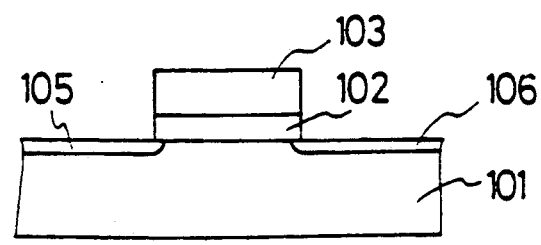

Then, a second boron adsorption layer 104 is formed in the FIG. 6F step, and thereafter diffusion and activation are undertaken again in the FIG. 6G step to thereby form a P+ type source region 105 and a P+ type drain region 106 to produce an MOS transistor. An increased amount of boron can be doped into the P type source and drain regions by repeatedly carrying out the formation of boron adsorption layer, and the diffusion and activation of boron. In the FIGS. 6A–6G embodiment, the sequence of boron adsorption and boron diffusion is carried out twice.

Figure 7:
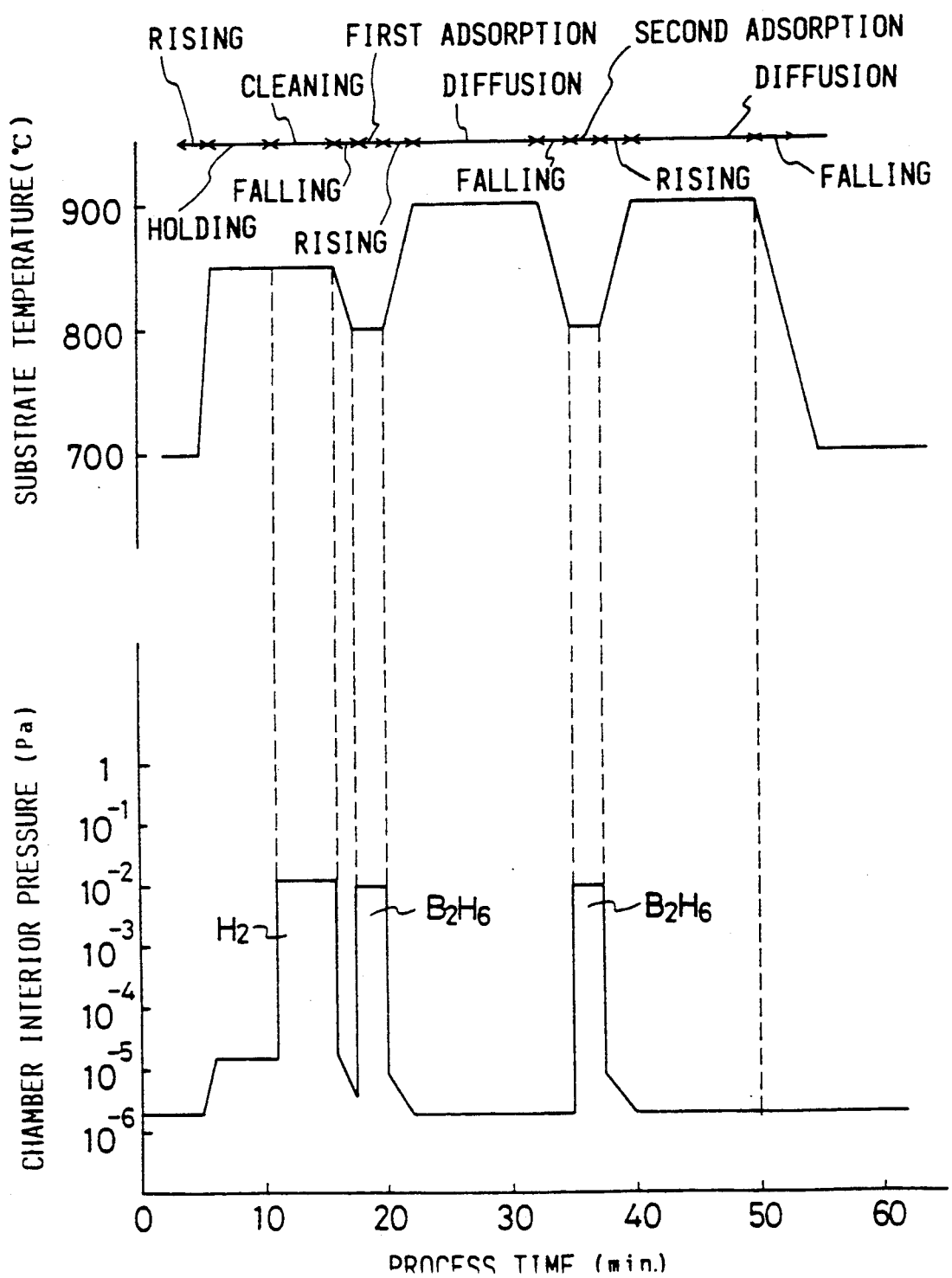
FIG. 7 is a process flow diagram showing the process of impurity adsorption layer formation in the second embodiment.

FIG. 7 is a process flow chart of the steps of adsorbing and doping the impurity to form the source region 105 and drain region 106. Firstly, the semiconductor substrate is disposed in a vacuum below about $10^{-2}$ Pa. Next, after stabilizing ambient conditions for several minutes, hydrogen gas is introduced into the vacuum chamber. An inert film in the form of about less than 30Å of natural oxide film is removed by the hydrogen from the surface of silicon substrate 101 to thereby clean the substrate surface. Consequently, activated silicon atoms are exposed on the substrate surface. Such cleaning process can be effected by other methods. Basically, the cleaning conditions are determined by vacuum degree and substrate temperature. Then, a compound gas containing boron, such as diborane gas, is applied to the cleaned surface of the substrate at a charging pressure of about $10^{-2}$ Pa to thereby form the boron adsorption layer on the silicon substrate 101. Lastly, thermal treatment is effected to diffuse boron into the substrate to activate the boron.

Figure 8:
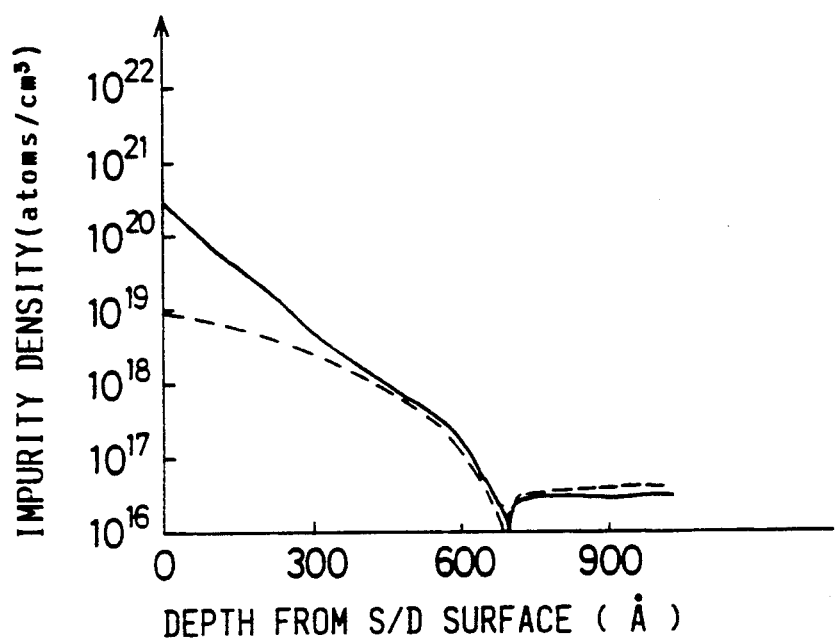
FIG. 8 is a graph showing the depth distribution of the impurity atoms of a sample obtained by the second embodiment.

FIG. 8 shows the depth profile of the boron density in the impurity-diffused region of a sample formed by repeatedly carrying out a cycle of boron adsorption and diffusion twice. As shown by the broken line curve, when carrying out only one cycle of the adsorption and diffusion, the surface impurity density is rather small, of the order of $10^{19}$ atoms/cm3. On the other hand, by carrying out the cycle of adsorption and diffusion twice, the surface impurity density can be raised to $10^{21}$ atoms/cm3 as shown by the solid curve, thereby reducing the resistivity of the impurity region.

Figure 9:
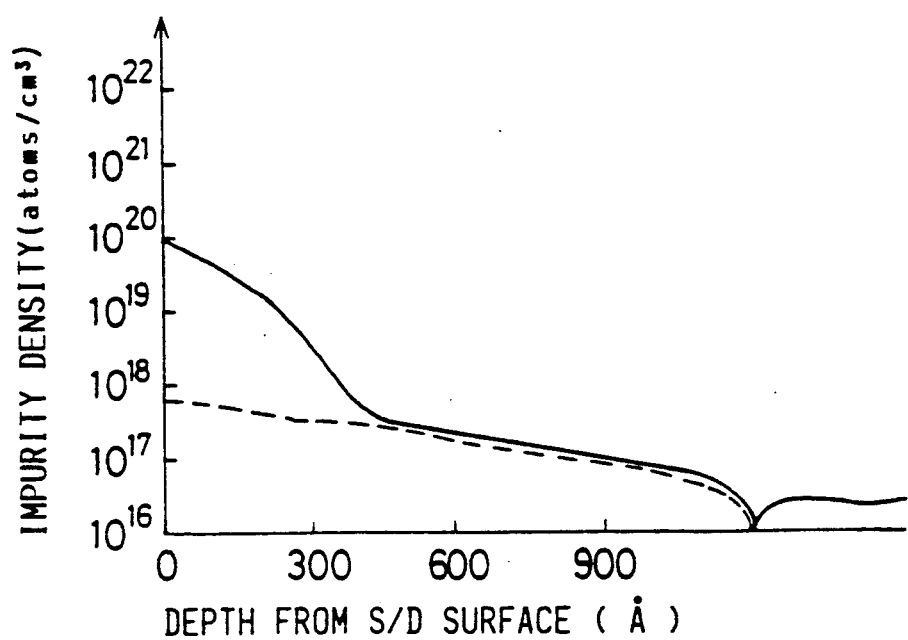
FIG. 9 is a graph showing the depth distribution of the impurity atoms of another sample obtained by the second embodiment.

FIG. 9 is a depth profile of the boron density of another sample obtained by the second embodiment. As indicated by the broken curve, a PN junction is formed in deep section from the surface by the first sequence of boron adsorption and diffusion. Then as indicated by the solid curve, the impurity density near the substrate surface can be raised by the subsequent identical process of the same adsorption and diffusion. Generally, PN junction depth and impurity density can be optimally controlled by a repetition of the adsorption and diffusion steps as well as by the charging gas pressure during the adsorption process and by thermal treatment temperature. As described above, according to the second embodiment, the impurity adsorption and diffusion is repeatedly effected on the activated surface of the semiconductor substrate to thereby form the MISFET source and drain regions having low resistivity, controllable PN junction depth and optimum impurity density.

THIRD EMBODIMENT

FIGS. 10A-10F show a third embodiment of the invention in which the solid-phase-diffusion and activation of impurity are carried out by ramp annealing or radiatior beam annealing. Ultrashallow source and drain regions can be formed by this method while avoiding damage to the semiconductor substrate surface. FIGS. 10A-10F are step sequence diagrams showing the method of forming a P channel MOS transistor on an N type silicon substrate.

Figure 10A:
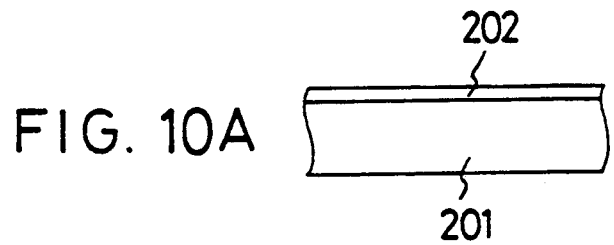
FIGS. 10A-10F are step sequence diagrams showing a third embodiment of the inventive method for producing a semiconductor device.
Figure 10B:
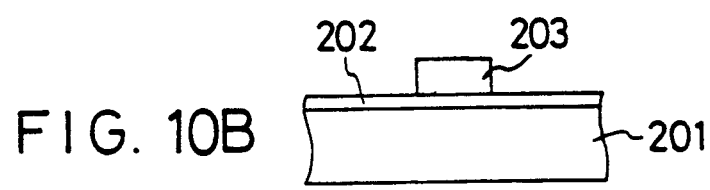
Figure 10C:
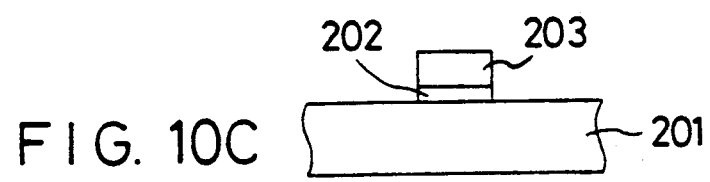
Figure 10D:
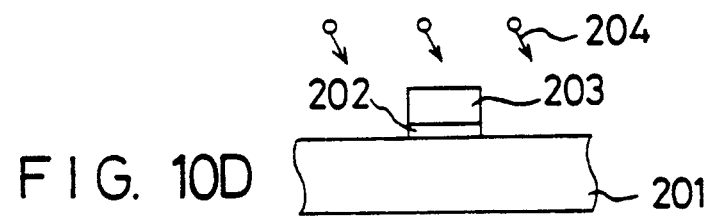
Figure 10E:
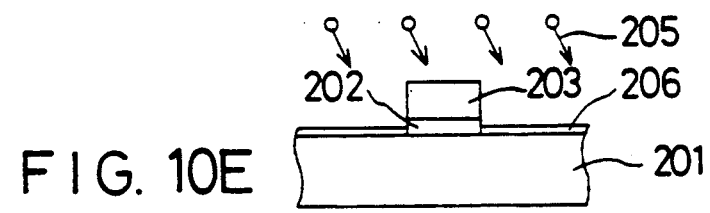

In the FIG. 10A step, a gate oxide film 202 is formed on the N type silicon substrate 201. Next in the FIG. 10B step, a gate electrode 203 is formed on the gate oxide film 202. Then in the FIG. 10C step, the gate oxide film 202 is removed, using the gate electrode 203 as a mask, to expose a surface of the N type silicon substrate 201. In the FIG. 10D step, cleaning is effected on a surface of the N type silicon substrate 201. The silicon substrate 201 is disposed in a vacuum chamber at a pressure of $1 \times 10^{-4}$ Pa. Hydrogen gas 204 is introduced for a given time interval at a pressure of $1.3 \times 10^{-2}$ Pa while maintaining the substrate temperature at, for example, 850° C. By this step, a natural oxide film is removed from the surface of the silicon substrate 201 to thereby expose a chemically active silicon face. After completing the surface cleaning in the FIG. 10D step, the hydrogen gas 204 is stopped and, as shown in FIG. 10E, a compound gas 205 containing boron, such as diborane gas, is applied to the cleaned surface of the substrate for a given interval at about $1.3 \times 10^{-2}$ Pa of the charging pressure to thereby form a boron adsorption layer 206 on the exposed surface of silicon substrate 201.

Figure 10F:
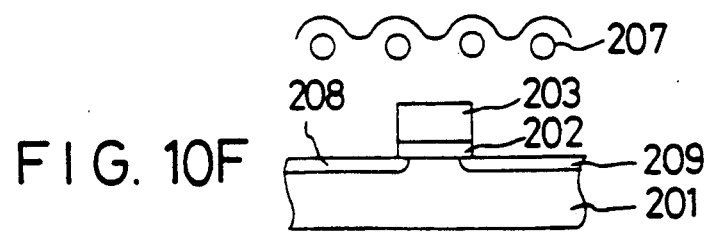

Further in the FIG. 10F step, thermal treatment is carried out by ramp annealing to activate the impurity in the adsorption layer 206 to form a P+ type source region 208 and a P+ type drain region 209. For example, a tungsten halogen lamp is utilized to heat the substrate surface at 1050° C. for 10 seconds to effect annealing. This ramp annealing can be carried out by a Xe arc lamp and other lamps than tungsten halogen lamp. Otherwise, a radiation beam, such as a laser beam or an electron beam, can be scanned along the substrate surface to effect selective annealing. The intensity and irradiation duration of the lamps or radiation beam can be controlled according to the desired junction depth of the drain and source regions. Such annealing is carried out after the adsorption process in the same vacuum chamber. Otherwise, the annealing may be carried out after the substrate is taken from the vacuum chamber.

Figure 11:
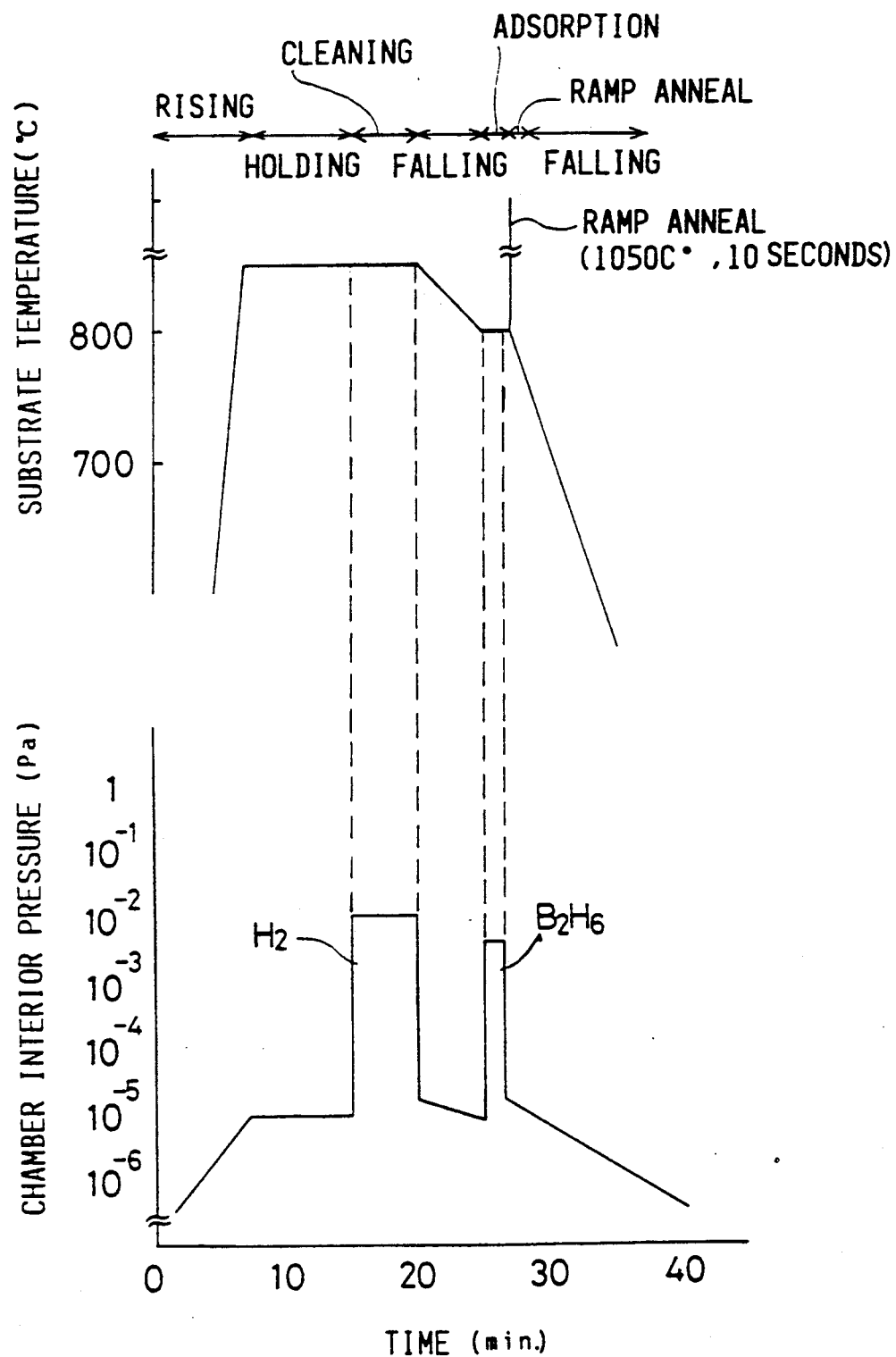
FIG. 11 is a process flow diagram showing the process of impurity adsorption layer formation and ramp annealing in the third embodiment.

FIG. 11 shows an example of a process sequence chart corresponding to the sequence of steps represented by FIGS. 10A-10F. In the FIG. 11 chart, the horizontal axis indicates time and the vertical axis indicates substrate temperature and chamber pressure.

As understood from FIG. 11, the background pressure of the chamber is normally held at high vacuum, i.e. a pressure less than $1 \times 10^{-4}$ Pa, when a gas is not introduced thereinto. However, the background or base pressure of less than $1 \times 10^{-4}$ Pa is not critical in this inventive method, and an optimum base pressure can be set according to the substrate temperature in the surface cleaning step and according to the kind of ambient gas within the chamber. In the FIG. 11 chart, after ramp annealing is carried out subsequently to the impurity adsorption, the substrate temperature is lowered. Otherwise, after ramp annealing, a thermal treatment may be added at 700° C.-900° C. for several tens of minutes to improve the electrical performance of the device.

Figure 12:
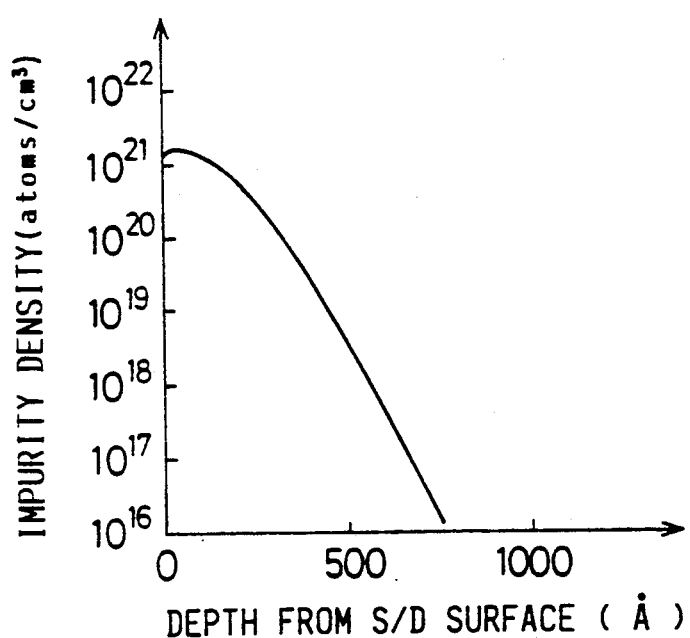
FIG. 12 is a graph showing the depth distribution of the impurity atoms measured after the ramp annealing.

FIG. 12 is a density profile of boron in the depth direction for a sample produced by sequential steps shown in FIGS. 10A-10F as well as in FIG. 11. The boron profile clearly shows an ultrashallow PN junction depth of less than several hundred Å.

In the above described embodiment, instead of diborane ($B_2H_6$), various III-group element compounds such as trimethyl gallium (TMG), trichloroboron ($BCl_3$) and decaborane ($B_{10}H_{14}$) can be effectively used as a P type doping gas for the P type MOS transistor. In a similar manner, an N type doping gas for the N type MOS transistor can be selected from among arsine ($AsH_3$), phosphorus trichloride ($PCl_3$), antimony pentachloride ($SbCl_5$), antimony hydride ($SbH_3$) and phosphine ($PH_3$). Further, the gate insulating film may be composed of a material other than silicon oxide. In the above described embodiments, the substrate temperature is set typically to 850° C. in the surface cleaning step, 825° C. in the forming of the impurity adsorption layer, and 1050° C. in ramp annealing. It is confirmed by the inventors from the recent study that the invention is effectively practiced by properly setting conditions in the respective steps. Namely, the substrate temperature is preferably set in the range from 800° C. to 1200° C. in the surface cleaning treatment, dependent on background pressure and kinds of ambient gas. The substrate temperature is set preferably in the range from 600° C. to 950° C. for forming the adsorption layer. Further, the substrate temperature can be set preferably in the range from 1000° C. to 1200° C. for ramp annealing.

As described above, according to the third embodiment, after forming the impurity adsorption layer or the cleaned and activated semiconductor substrate, ramp annealing or radiation beam annealing is carried out to thereby form a shallow source region and drain region in the MISFET.

FOURTH EMBODIMENT

FIGS. 13A-13E show a fourth embodiment of the invention in which source and drain regions are formed by alternately depositing an impurity adsorption layer and a semiconductor epitaxial layer. By such method, the source and drain regions are given an ultrashallow depth and sufficiently small resistivity to constitute a high speed semiconductor device.

Figure 13A:
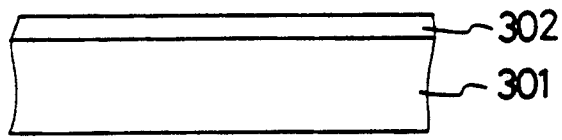
FIGS. 13A-13E are step sequence diagrams showing a fourth embodiment of the inventive method for producing a semiconductor device.
Figure 13B:
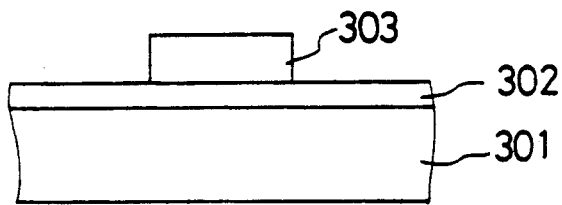
Figure 13C:
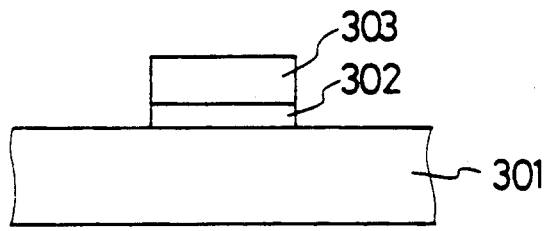
Figure 13D:
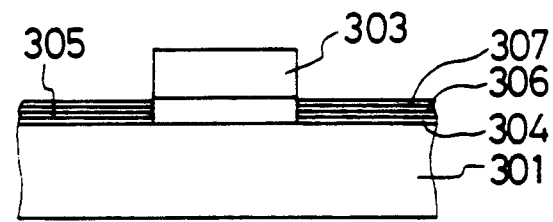

In the FIG. 13A step, a gate oxide film 302 is formed on the N type silicon substrate 301. Next in the FIG. 13B step, a gate electrode 303 is formed on the gate oxide film 302. Then in the FIG. 13C step, the gate oxide film 302 is removed, using gate electrode 303 as a mask, to expose a surface of the N type silicon substrate 301. Subsequently in the FIG. 13D step, a first boron adsorption layer 304, a first silicon epitaxial layer 305, a second boron adsorption layer 306 and a second silicon epitaxial layer 307 are successively formed on the exposed surface of the N type silicon substrate 301.

Figure 13E:
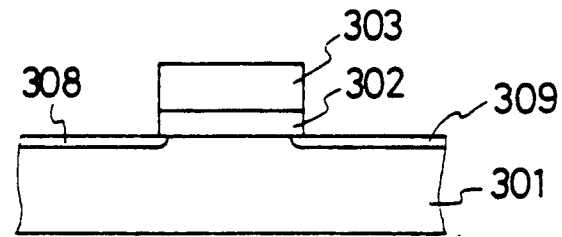

Further, in the FIG. 13E step, thermal treatment is carried out at 700° C.-900° C. to form a P+ type source region 308 and a P+ type drain region 309 to thereby produce P type metal-oxide-semiconductor transistor. Boron can be doped to a high density into the substrate surface to form the P+ type source and drain regions by increasing the number of boron adsorption layers and silicon epitaxial layers. In the FIGS. 13A-13E embodiment, formation of the boron adsorption layer and silicon epitaxial layer is carried out twice. However, the top layer may be either an adsorption layer or an epitaxial layer for producing the source region 308 and the drain region 309. Further, the bottom layer may be either an adsorption layer or an epitaxial layer. The number of layers should be limited such that the total thickness of the multilayer structure is less than the thickness of the gate insulating film to avoid electrical shorts between the gate electrode 303 and the multilayer structure. The boron adsorption layer and silicon epitaxial layer cannot be deposited on the gate oxide film 302 and other oxide films due to their chemical nature.

Figure 14:
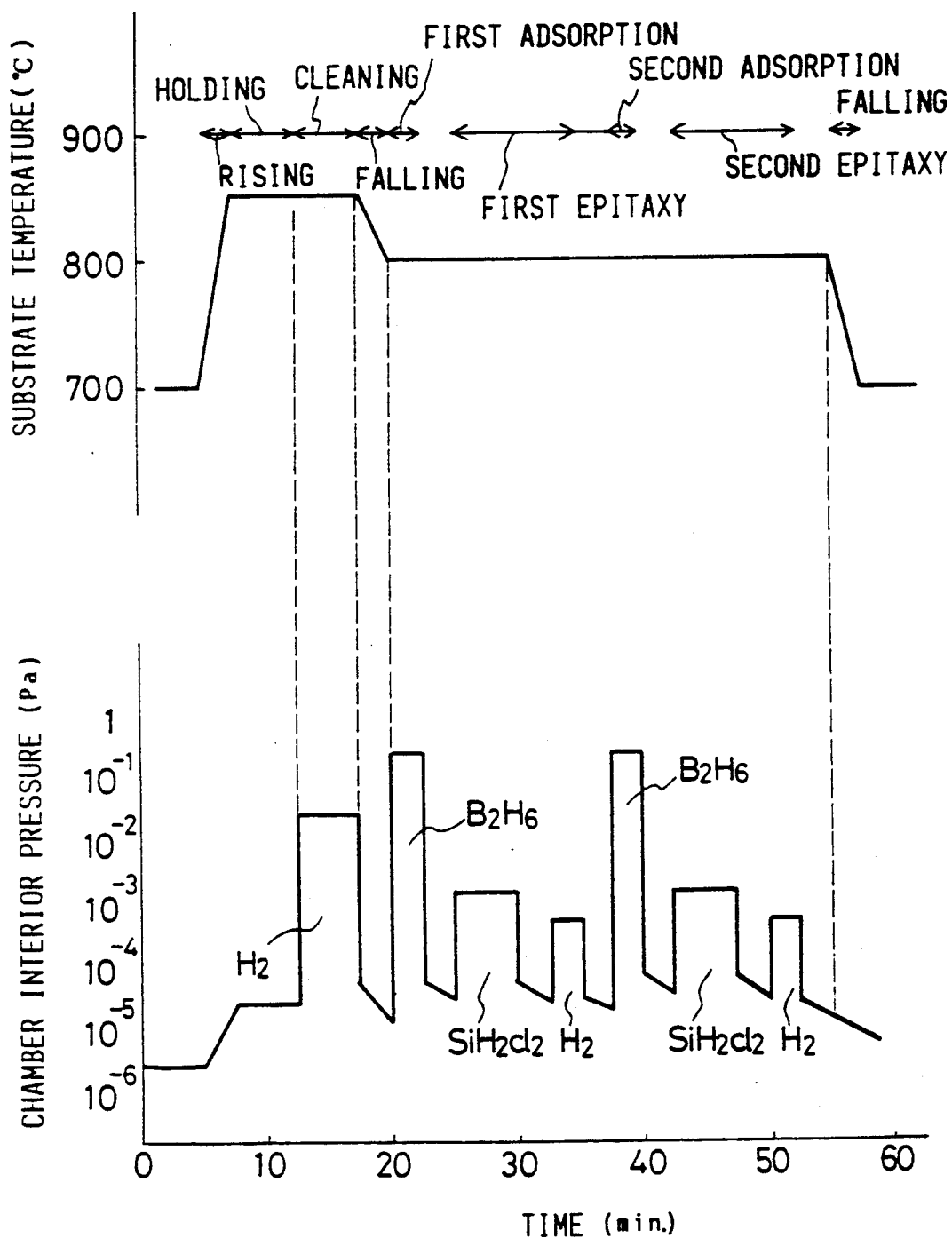
FIG. 14 is a process flow diagram showing the process of impurity-doped layer formation in the fourth embodiment.

FIG. 14 is a process flow chart of the steps of adsorbing and doping the impurity to form the source region 308 and drain region 309. Firstly, the semiconductor substrate is heated at about 800° C. in a vacuum of about several milli Torrs. Next, after stabilizing ambient conditions for several minutes, hydrogen gas is introduced into the chamber. The inert film in the form of about less than 30Å of a natural oxide film is removed by the hydrogen from the surface of silicon substrate 301 to thereby clean the substrate surface. Consequently, activated silicon atoms are exposed on the substrate surface. Then, a compound gas containing boron, such as diborane gas, is applied to the cleaned surface of the substrate at a charging pressure of about $10^{-2}$ Pa. Prior to this step, a silicon epitaxial under-layer may be formed on the substrate. Next, dichlorosilane ($SiH_2Cl_2$) and hydrogen ($H_2$) are subsequently introduced into the reaction chamber to grow a silicon thin film on the boron adsorption layer. Silane gas ($SiH_4$) may be utilized, instead, to grow the silicon thin film. The silicon thin film and the boron adsorption film are selectively formed on the cleaned silicon semiconductor surface, but are not grown on the oxide film, because the oxide film does not have seeds for epitaxial growth of silicon and for deposition of boron.

Figure 15:
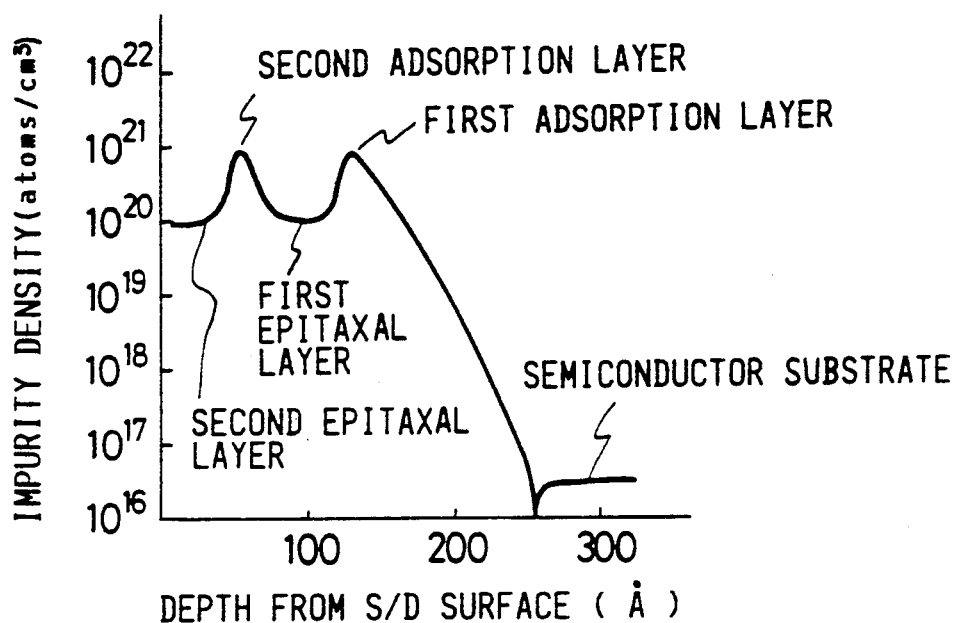
FIG. 15 is a graph showing the depth distribution of the impurity atoms of a sample obtained by the fourth embodiment.

FIG. 15 shows a depth profile of the boron density in the impurity region formed by the FIG. 14 process. A great amount of boron is contained in the first and second adsorption layers. Further, the epitaxial layers are also doped with a great amount of boron due to diffusion from the adsorption layers. The FIG. 15 profile is obtained by twice carrying out the formation of adsorption and epitaxial layers. Greater amounts of boron can be doped or introduced by increasing the number of repetitions of the deposition operations.

Figure 16:
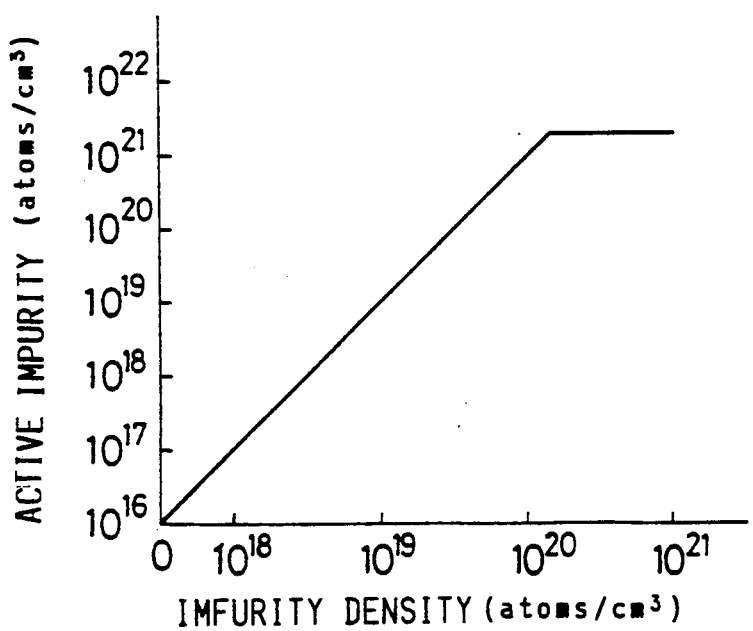
FIG. 16 is a characteristic diagram showing the relation between activated impurity density and doped impurity density.

FIG. 16 is a graph showing the relation between the density of deposited boron impurity atoms and the density of activated boron impurity atoms. The activated boron density saturates when the deposited or introduced boron density exceeds $10^{21}$ atoms/cm3. Therefore, as shown in the FIG. 15 profile, by superposing a silicon epitaxial layer having a small amount of boron atoms on an adsorption layer containing an excess amount of boron, the adsorbed boron atoms are diffused into the epitaxial layer to thereby facilitate activation of the boron impurity. Further, the introduced boron atoms are capped or blocked inside by providing the epitaxial layer over the adsorption layer. The introduced boron can be efficiently activated without diffusing outward to thereby reduce the surface resistivity of source region 308 and drain region 309. After producing the FIG. 15 profile, further thermal treatment is carried out at about 900° C. so as to activate almost all of the boron atoms to further reduce the resistivity.

According to the fourth embodiment of producing the semiconductor device, the source region 308 and the drain region 309 are formed in a shallow portion of the silicon substrate 301 to thereby reduce the distance between the source region 308 and the drain region 309. Namely, the size of the MOS transistor can be considerably reduced. Moreover, the impurity region is formed by chemical adsorption and epitaxy to thereby cause no damage or defects in the transistor.

In this embodiment, for introducing the impurity to form the MISFET source and drain regions, impurity adsorption and silicon epitaxy are repeatedly and alternately carried out on the activated semiconductor surface so as to form the shallow impurity region of low surface resistivity.

FIFTH EMBODIMENT

FIGS. 17A-17G show a fifth embodiment of the invention in which source and drain regions are formed by removing an oxide film from the semiconductor surface, depositing an impurity adsorption layer, forming a semiconductor epitaxial layer, forming advantageously an insulating film, and diffusing the impurity.

Figure 17A:
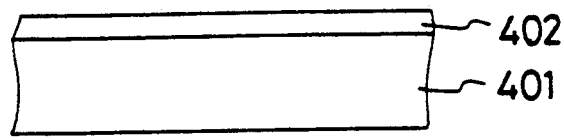
FIGS. 17A-17G are step sequence diagrams showing a fifth embodiment of the inventive method for producing a semiconductor device.
Figure 17B:
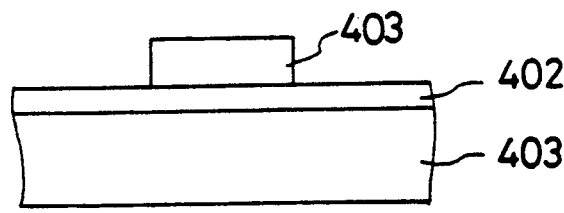
Figure 17C:
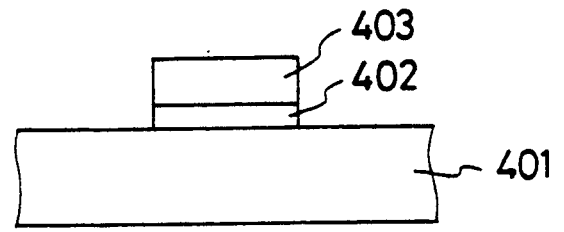
Figure 17D:
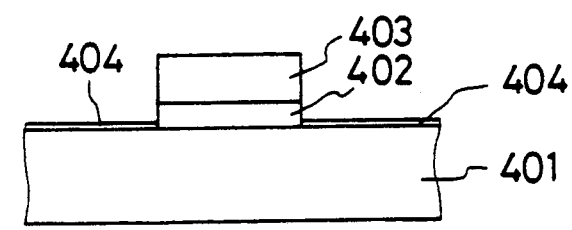
Figure 17E:
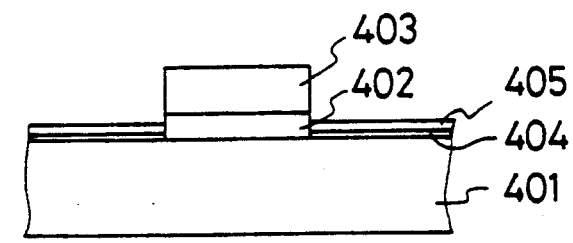
Figure 17F:
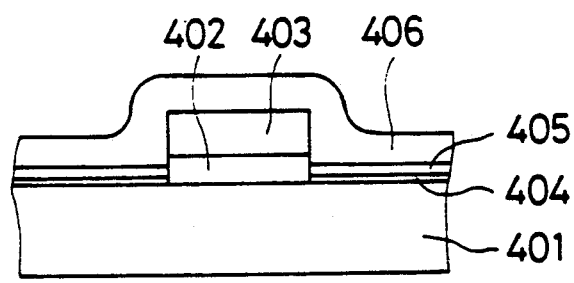
Figure 17G:
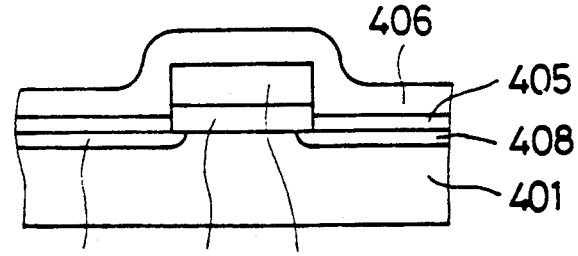

In the FIG. 17A step, a gate oxide film 402 is formed on the N type silicon substrate 401. Next in the FIG. 17B step, a gate electrode 403 is formed on the gate oxide film 402. Then in the FIG. 17C step, the gate oxide film 402 is removed, using the gate electrode 403 as a mask to expose a surface of the N type silicon substrate 401. Subsequently in the FIG. 17D step, a boron adsorption layer 404 is formed on the exposed surface of the N type silicon substrate 401. Then in the FIG. 17E step, a silicon epitaxial layer 405 is formed on the boron adsorption layer 404. Thereafter, in the FIG. 17F step, a silicon oxide film layer 406 is deposited. Further, in the FIG. 17G step, a thermal treatment is carried out at 700° C.-900° C. to form a P+ type source region 407 and a P+ type drain region 408 to thereby produce a P type metal-oxide-semiconductor transistor.

Figure 18:
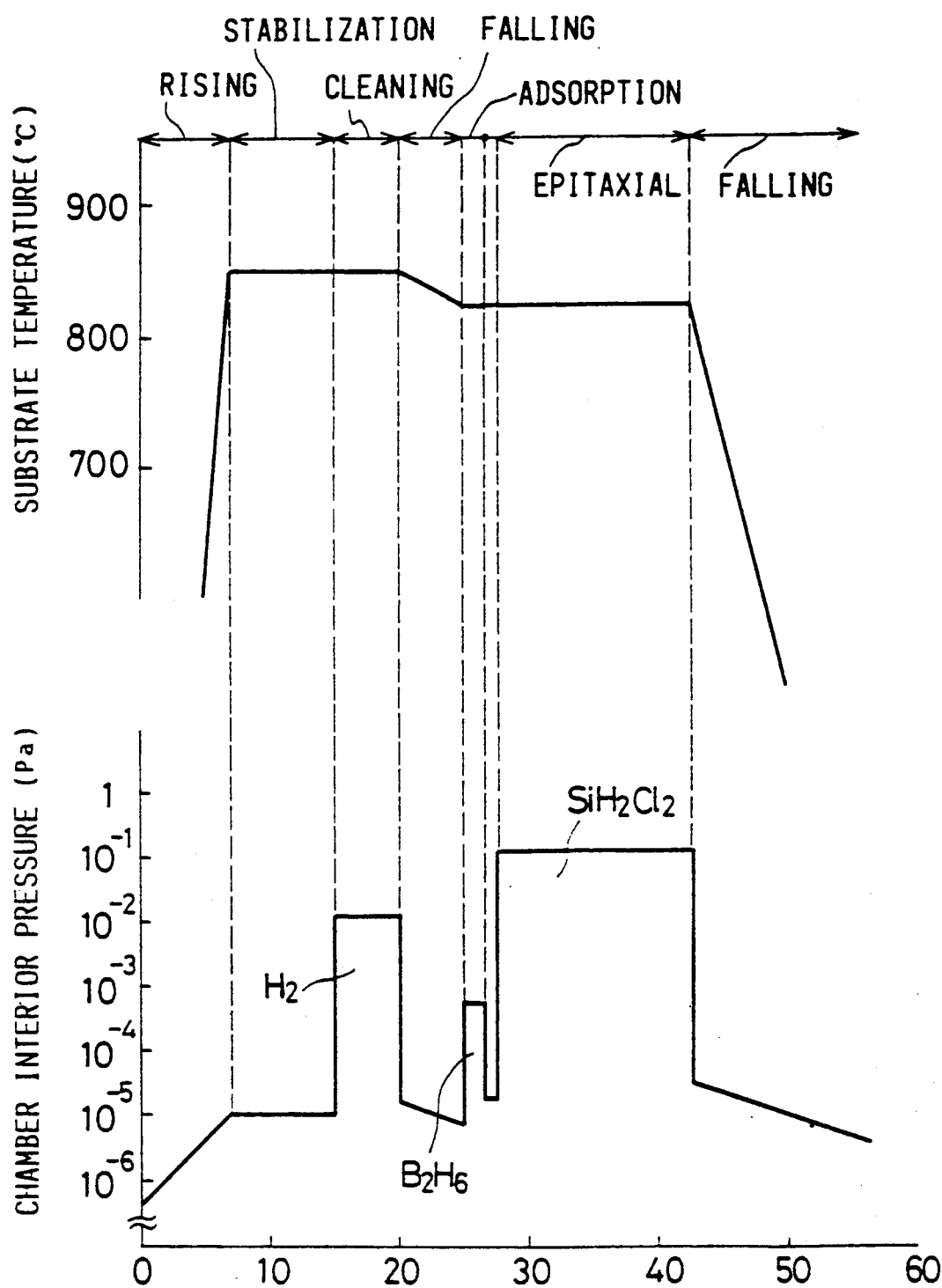
FIG. 18 is a process flow diagram showing the process of impurity adsorption layer and epitaxial layer formation in the fifth embodiment.

FIG. 18 is a process flow chart of the steps of adsorbing the impurity layer 404 and depositing epitaxial layer 405 to form the source region 407 and drain region 408. Firstly, the semiconductor substrate is heated at about 800° C. or more in vacuum of less than about $10^{-4}$ Pa. In this embodiment, the substrate temperature is set to 850° C., and the chamber pressure is set to $1\times10^{-5}$ Pa. Next, after stabilizing ambient conditions for several minutes, hydrogen gas is introduced into the chamber at $10^{-2}$ Pa cf pressure. The inert film in the form of a natural oxide film less than 30Å thick is removed by the hydrogen from the surface of silicon substrate 401 to thereby clean the substrate surface. Consequently, activated silicon atoms are exposed on the substrate surface. Then, a compound gas containing boron, such as diborane gas, is applied to the cleaned surface of the substrate while maintaining the substrate temperature at 700° C.-900° C. In this embodiment, diborane gas is introduced for 100 seconds at $1\times10^{-2}$ Pa of pressure while setting the substrate temperature at 825° C. so as to form the boron adsorption layer 404 on the substrate surface 401. Next, a compound gas containing dichlorosilane ($SiH_2Cl_2$) or silane ($SiH_4$) is introduced into the reaction chamber to grow a silicon thin film epitaxial layer on the boron adsorption layer while maintaining the substrate temperature at 700° C.-900° C. Silane gas ($SiH_2Cl_2$) and hydrogen chloride (HCl) may be utilized, instead, to grow the silicon thin film selectively on the silicon face. In this embodiment, dichlorosilane gas is introduced for 13 minutes at $103\times10^{-3}$ Pa charging pressure to form an about 50Å thick silicon epitaxial layer. The thickness of the epitaxial layer should be less than that of the gate oxide film so as to avoid an electrical short between the silicon epitaxial layer and the gate electrode layer. By forming the silicon epitaxial layer on the boron adsorption layer, boron can be efficiently diffused into the epitaxial layer to facilitate the activation of boron.

Figure 19:
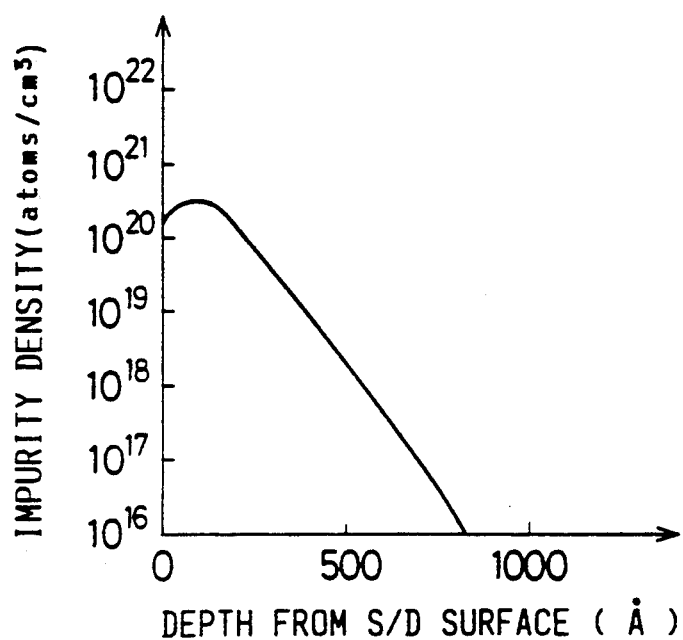
FIG. 19 is a graph showing the depth distribution of the impurity atoms measured after the formation of epitaxial layer in the fifth embodiment.

FIG. 19 shows the depth profile of the boron density from the silicon epitaxial layer in an intermediate sample obtained according to the FIG. 18 process. Peak boron density and boron dose can be adjusted according to the boron charging pressure and boron charging time interval for forming the adsorption layer.

Figure 20:
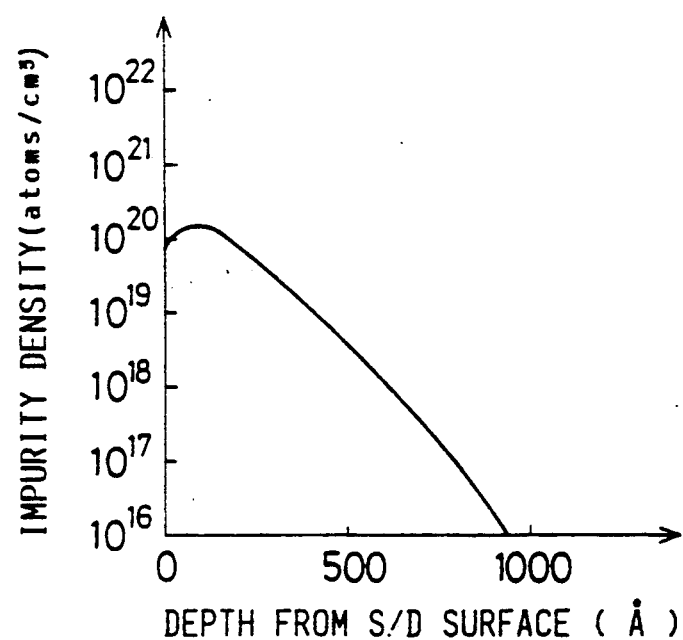
FIG. 20 is a graph showing another depth distribution of the impurity atoms measured after thermal treatment in the fifth embodiment.

FIG. 20 shows another depth profile of boron density from the epitaxial layer surface in a final sample. The final sample is obtained by the steps of forming the silicon epitaxial layer, depositing the silicon oxide film layer by regular CVD, plasma CVD, or sputtering, and then carrying out thermal treatment at 850° C. for 30 minutes. PN junction depth can be set to a desired level in the source and drain regions by adjusting the temperature and duration of the thermal treatment.

According to the fifth embodiment of producing the semiconductor device, the P+ source region 407 and the P+ drain region 408 are formed in an extremely shallow portion of the silicon substrate. Therefore, the size of the MOS transistor can be considerably reduced. Moreover, the impurity region is formed by chemical adsorption and epitaxy to thereby cause no damage or defects on the transistor.

A silicon epitaxial layer may be formed on the boron adsorption layer by silicon molecular layer epitaxy (Si-MLE) as disclosed, for example, in Japanese laid-open patent application Nos. 153978/1984 and 209575/1986. The Si-MLE is carried out by introducing in a pulsed manner and alternately dichlorosilane gas and hydrogen gas so as to control the layer thickness by molecular layer levels to thereby quite uniformly and accurately form the epitaxial layer. Further, prior to the adsorption process, an oxide film can be removed from the semiconductor surface by raising the vacuum degree or substrate surface temperature or by prolonging the thermal treatment without introducing hydrogen gas.

SIXTH EMBODIMENT

In the sixth embodiment, a major part of the source and drain regions is provided above the substrate surface level in the MOS type semiconductor device. Further, the top surface of source region and drain region is set below the boundary level between the gate oxide film and the gate electrode. By such construction, the effective PN junction depth can be reduced in the source and drain regions, and further electrical shorts can be effectively avoided between the gate electrode and the source or drain regions.

On the other hand, in the conventional MOS type semiconductor device, the source and drain regions are formed in the semiconductor substrate level with a considerable depth dimension of the junction. Such construction cannot reduce the junction depth in the source and drain region to thereby hinder microminiaturization of the semiconductor device.

As described above, according to the sixth embodiment, a major part of the source and drain regions are formed above the substrate surface level to thereby reduce PN junction depth xj comparable to or less than the inversion region width of the channel region between the source and drain regions, thereby suppressing the short channel effect and punch-through and concurrently reducing parasitic capacitance. Namely, in the sixth embodiment, a major part of the source and drain regions is provided above the boundary level between the substrate surface and the gate insulating film in the MOS type semiconductor device. Further, the thickness of the source region and drain region above the boundary is set less than the thickness of the gate oxide film. By such construction, the effective PN junction depth can be reduced in the semiconductor substrate below the boundary.

Figure 21:
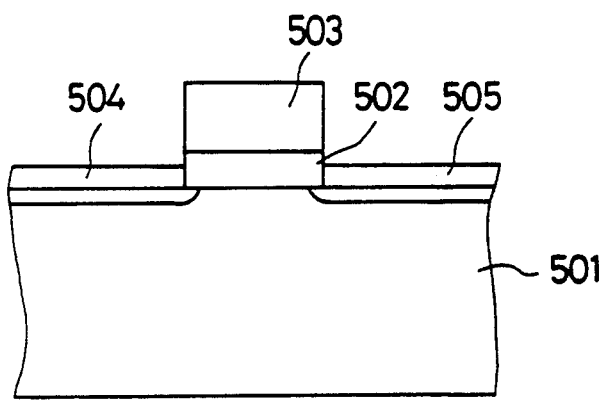
FIG. 21 is a structural sectional view of the MOS type semiconductor device according to the sixth embodiment.
Figure 22A:
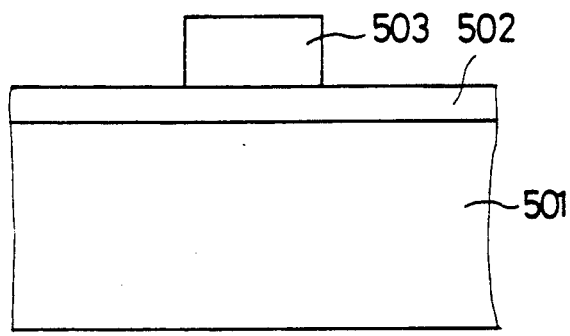
FIGS. 22A-22D are step sequence diagrams showing the sixth embodiment of the inventive method for producing a semiconductor device.
Figure 22C:
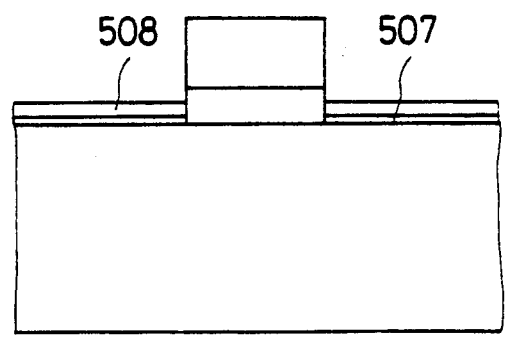
Figure 22B:
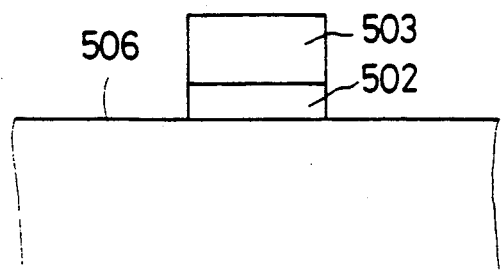
Figure 22D:
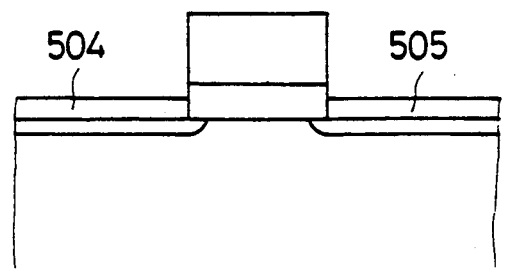

The following detailed description is given for the sixth embodiment with reference to FIGS. 21-24. Referring to FIG. 21, a P+ type source region 504 and a P+ type drain region 505 are provided on a surface of an N type silicon substrate 501. A gate electrode 503 is disposed above a gate oxide film 502 on a channel region between the source and drain regions. The semiconductor device structure of the sixth embodiment is characterized in that the top faces of the source region 504 and the drain region 505 are disposed above the boundary or interface between the N type silicon substrate 501 and the gate oxide film 502, and below the interface between the gate electrode 503 and the gate oxide film 502.

The above described structure can be formed by the method shown in FIGS. 22A-22D. Namely, in the FIG. 22A step, gate oxide film 502 is formed on the silicon substrate 501 of a first conductivity type, and thereafter gate electrode 503 is formed on gate oxide film 502. Then in the FIG. 22B step, gate oxide film 502 is partially removed, using gate electrode 503 as a mask, to expose a surface 506 of the silicon substrate 501. Subsequently in the FIG. 22C step, an impurity adsorption layer 507 of a second conductivity type is formed on the exposed surface 506 of silicon substrate 501. Further, an epitaxial layer 508 is formed on impurity adsorption layer 507 with a thickness less than that of gate oxide film 502. Lastly in the FIG. 22D step, thermal treatment is carried out to form source region 504 and a drain region 505.

Figure 23:
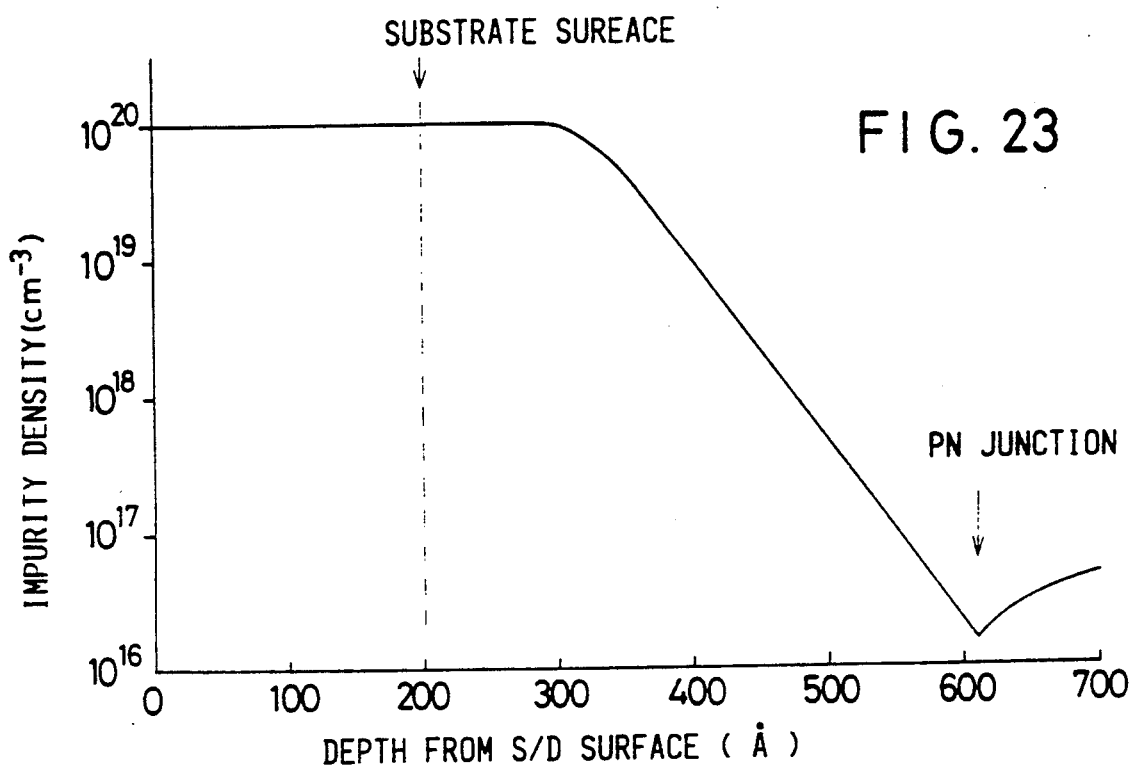
FIG. 23 is a graph showing the depth distribution of the impurity atoms in the source and drain regions of the MOS type semiconductor device according to the sixth embodiment.

FIG. 23 shows the depth profile of the impurity density in the source and drain regions of the P channel MOS transistor produced by the step sequence shown by FIGS. 22A-22D. The FIG. 23 profile is measured for a sample produced such that diborane ($B_2H_6$) is utilized as a source gas to form the impurity adsorption layer 507 in the FIG. 22C step. Further, the epitaxial layer 508 is formed using dichlorosilane ($SiH_2Cl_2$) as a source gas to effect selective deposition. The annealing is carried out at a substrate temperature of 900° C. in the FIG. 22D step. As seen from FIG. 23, the PN junction depth can be set less than 500Å with respect to the original silicon substrate surface, i.e., the interface between the silicon substrate and the gate oxide film in the MOS type semiconductor device according to the sixth embodiment.

Figure 24:
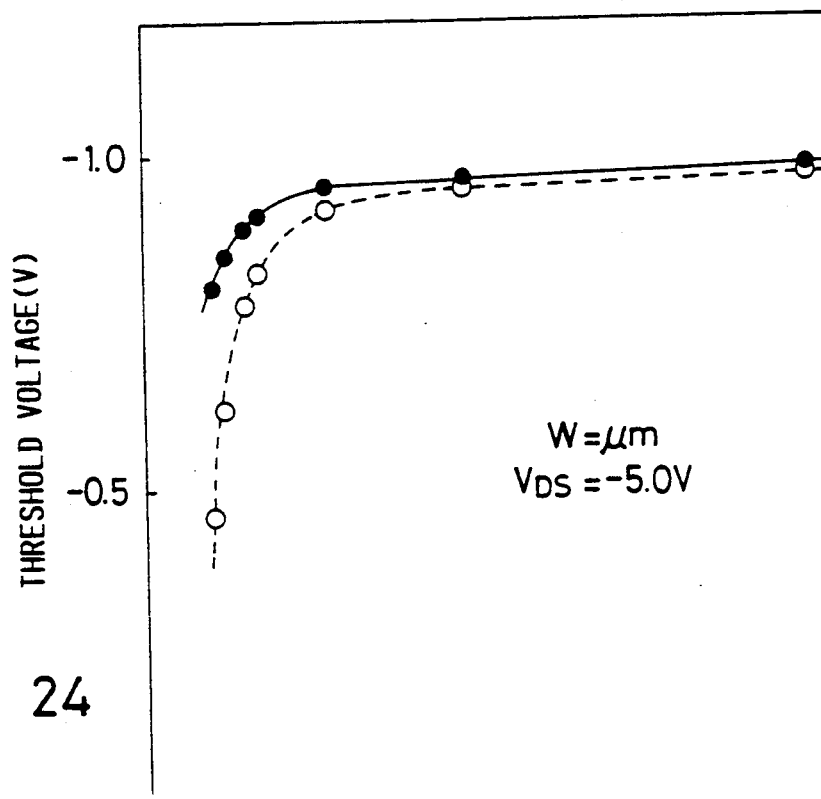
FIG. 24 is an illustrative diagram showing a comparison between the MOS type semiconductor device according to the sixth embodiment and the conventional MOS type semiconductor device with respect to short channel effect.

FIG. 24 is a diagram indicative of the short channel effect in the MOS type semiconductor device where the horizontal axis denotes channel length and the vertical axis denotes the threshold voltage of the channel region. Shaded dots indicate data related to the MOS type semiconductor device according to the sixth embodiment and white dots indicate data related to a conventional MOS type semiconductor device. The FIG. 24 data indicates that the MOS type semiconductor device according to the sixth embodiment is structurally more effective to suppress the short channel effect as compared to the conventional MOS type semiconductor device.

Figure 25A:
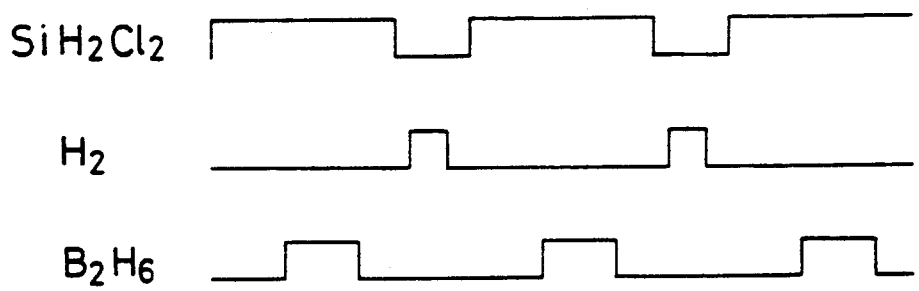
FIGS. 25A and 25B show modifications of the sixth embodiment in the form of a sequence chart of gas charging valve operation during the formation of ar impurity-doped epitaxial layer.

A modification of the sixth embodiment is described with reference to FIGS. 25A, 25B and 26. In this modification, in place of the impurity adsorption layer 507 and the subsequent epitaxial layer 508 formed in the FIG. 22C step, an impurity-doped epitaxial layer is formed by concurrently carrying out impurity introduction and selective epitaxy. In this case, according to the sequence shown in FIG. 25A, diborane ($B_2H_6$) is introduced as a source gas of dopant, and dichlorosilane ($SiH_2Cl_2$) is introduced as a source gas of silicon together with a reaction gas in the form of hydrogen ($H_2$) gas effective to cause reductive reaction with these source gases. When using an N type silicon substrate doped with about $5 \times 10^{16}$ cm$^{-3}$ of antimony (Sb) and forming P+ type source and drain regions in the substrate surface to form the P channel MOS transistor, after forming the impurity-doped silicon epitaxial layer, annealing is carried out within an $N_2$ gas atmosphere at 900° C. for 10 minutes so as to diffuse the dopant, i.e., boron (B), into the substrate to a depth, xj, about 800Å as shown in FIG. 26. By such processing, P+ type source region and P+ type drain region are formed at xj=about 0.08μ.

Figure 25B:
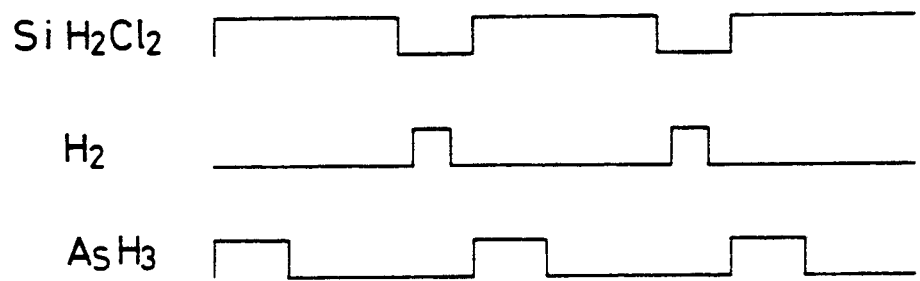
Figure 26:
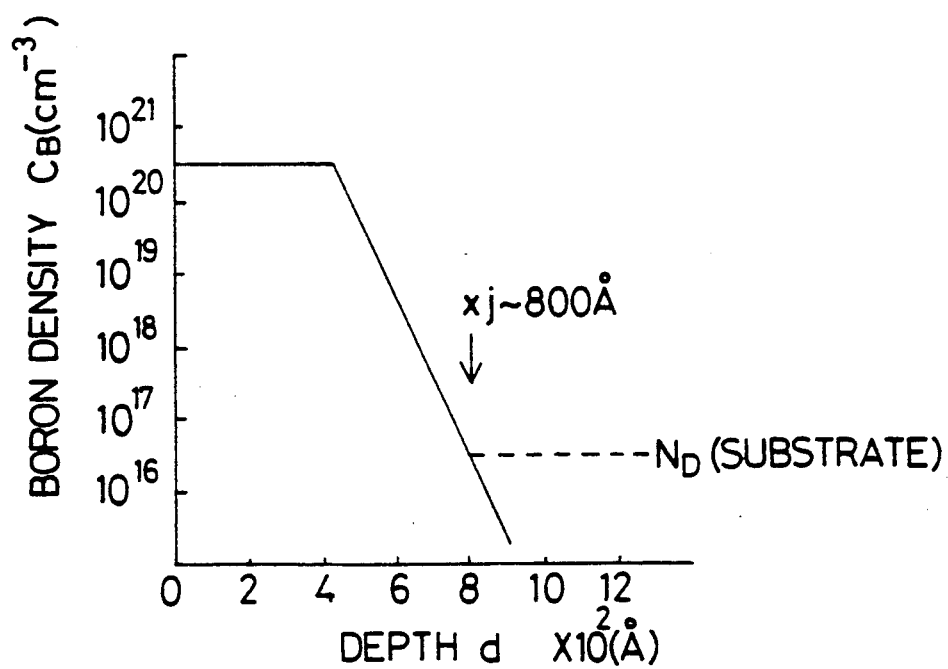
FIG. 26 shows the depth profile of boron density in the source and drain regions of MOSFET produced by the FIG. 25A method.

In case of producing an N channel MOS transistor, arsine ($AsH_3$) is applied as a doping gas to the surface of a P type silicon substrate together with the other source gases according to the FIG. 25B sequence to form an arsenic-doped epitaxial layer. Consequently, N+ type source and drain regions are formed in a shallow portion of the substrate. The annealing may be effected after growth of the epitaxial layer, or otherwise subsequent reflow of inter-layer insulating film or contact reflow may be utilized for the annealing.

SEVENTH EMBODIMENT

FIGS. 27A–27E show a seventh embodiment of the invention in which source and drain regions are formed by means of doped-epitaxy.

Figure 27A:
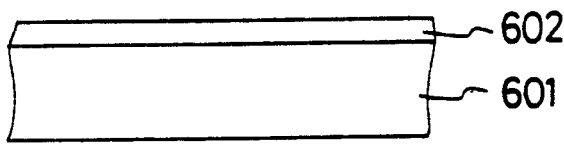
FIGS. 27A-27E are step sequence diagrams showing a seventh embodiment of the inventive method for producing a semiconductor device.
Figure 27B:
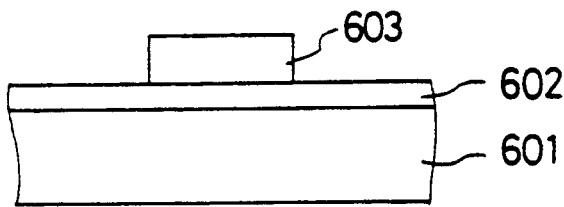
Figure 27C:
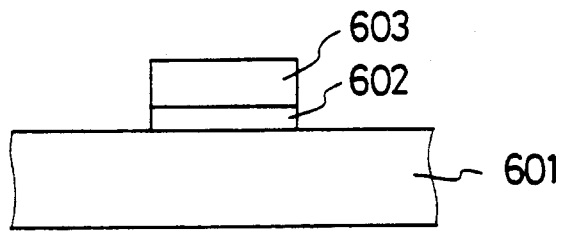
Figure 27D:
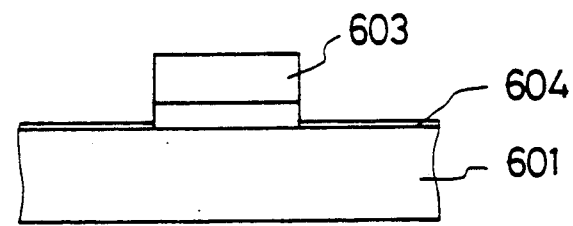
Figure 27E:
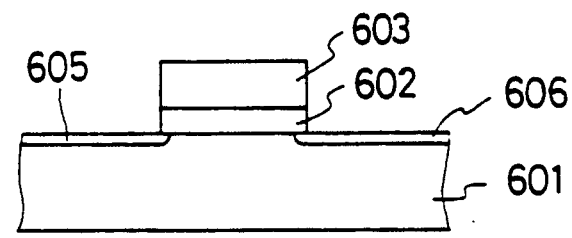

In the FIG. 27A step, a gate oxide film 602 is formed on the N type silicon substrate 601. Next in the FIG. 27B step, a gate electrode 603 is formed on the gate oxide film 602. Then in the FIG. 27C step, the gate oxide film 602 is removed, using the gate electrode 603 as a mask, to expose a surface of the N type silicon substrate 601. Subsequently in the FIG. 27D step, a boron-doped epitaxial layer 604 is formed on the exposed surface of N type silicon substrate 601. Further in the FIG. 27E step, thermal treatment is carried out at 700° C.–950° C. to form a P+ type source region 605 and a P+ type drain region 606 to thereby produce a P type metal-oxide-semiconductor transistor.

Figure 28:
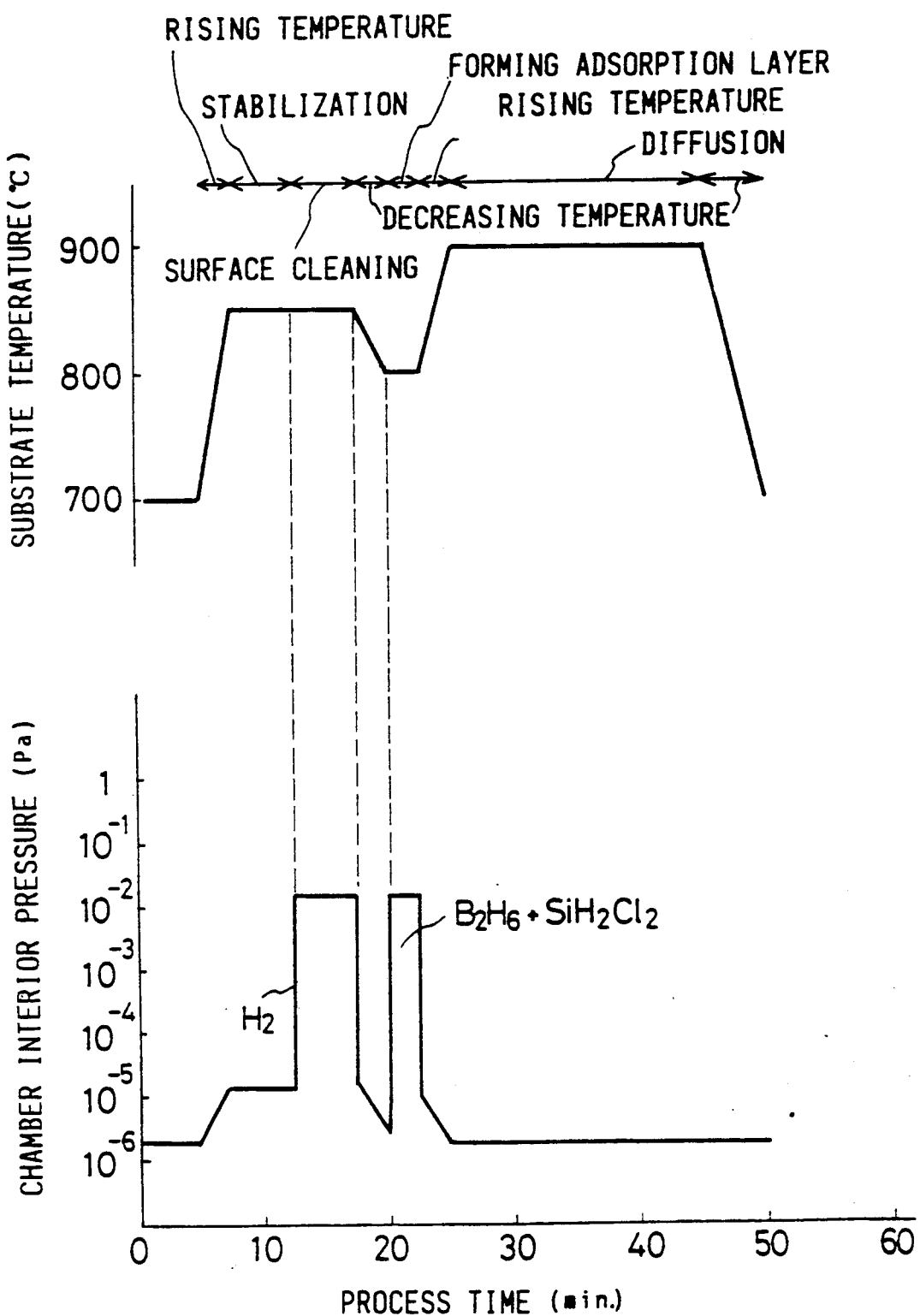
FIG. 28 is a process flow diagram showing the process of impurity-doped layer formation in the seventh embodiment.

FIG. 28 is a process flow chart for the step of depositing the doped-epitaxial layer to form the source region 605 and drain region 606. Firstly, the semiconductor substrate is heated at about 850° C. in a vacuum of about less than $10^{-4}$ Pa. Next, after stabilizing ambient condition for several minutes, hydrogen gas is introduced into the chamber. The inert film in the form of a natural oxide film with a thickness of about 30Å is removed by the hydrogen from the surface of silicon substrate 601 to thereby clean the substrate surface. Consequently, activated silicon atoms are exposed on the substrate surface.

Then, a compound gas containing boron, such as diborane gas, and another compound gas containing a semiconductor component, such as $SiH_2Cl_2$, are applied to the cleaned surface of the substrate concurrently to thereby form the adsorption layer containing boron and silicon on the silicon substrate 601. Lastly, the thermal treatment is carried out to diffuse boron into the substrate to activate the boron, thereby reducing the surface resistivity of the source region 605 and the drain region 606.

According to the seventh embodiment, the source region 605 and the drain region 606 are formed in a shallow portion of the silicon substrate 601. Therefore, the effective channel length can be held between the source region 605 and the drain region 606 in registration with the lengthwise dimension of the gate as opposed to the conventional device produced by ion implantation. Stated otherwise, the gate length can be reduced to form fine and high grade MOS transistor.

EIGHTH EMBODIMENT

In order to form ultrashallow source and drain regions, the eighth embodiment of the inventive method is composed of the steps of forming an impurity adsorption layer on a semiconductor substrate surface, etching the surface of a field insulating film, and forming a semiconductor epitaxial layer. Otherwise in a modification, an impurity adsorption layer is formed on a semiconductor substrate surface, then a semiconductor epitaxial layer is deposited, and thereafter a surface of the field insulating film is etched away. Consequently, there is produced a semiconductor device having a small size, fast operating speed and complete element isolation.

FIGS. 29A–29E show a step sequence of the eighth embodiment where an N type silicon substrate 701 has formed thereon a field insulating film 702 effective to define a device region and an isolation region, a gate oxide film 703 and a gate electrode 704 in a manner similar to the conventional method. In the FIG. 29A step, the gate oxide film 703 is removed, using the gate electrode 704 as a mask, to expose a surface of the N type silicon substrate 701. Next in the FIG. 29B step, a boron-containing gas, such as diborane gas, is applied to the exposed surface of the N type silicon substrate 701 to form a boron adsorption layer 705. At this time, boron is substantially selectively adsorbed on the exposed part of N type silicon substrate 701, but is also adsorbed lightly, at 706, on the field insulating film 702. Thereafter, if a silicon layer were directly deposited on the substrate, polysilicon 712 would be also deposited on the field insulating film 702 since the field insulating film 702 has been lightly covered by the thin boron layer. In such case, there would be disadvantageously caused electrical shorts between adjacent transistors.

Figures 29A, 29B, 29C, 29D, 29E:
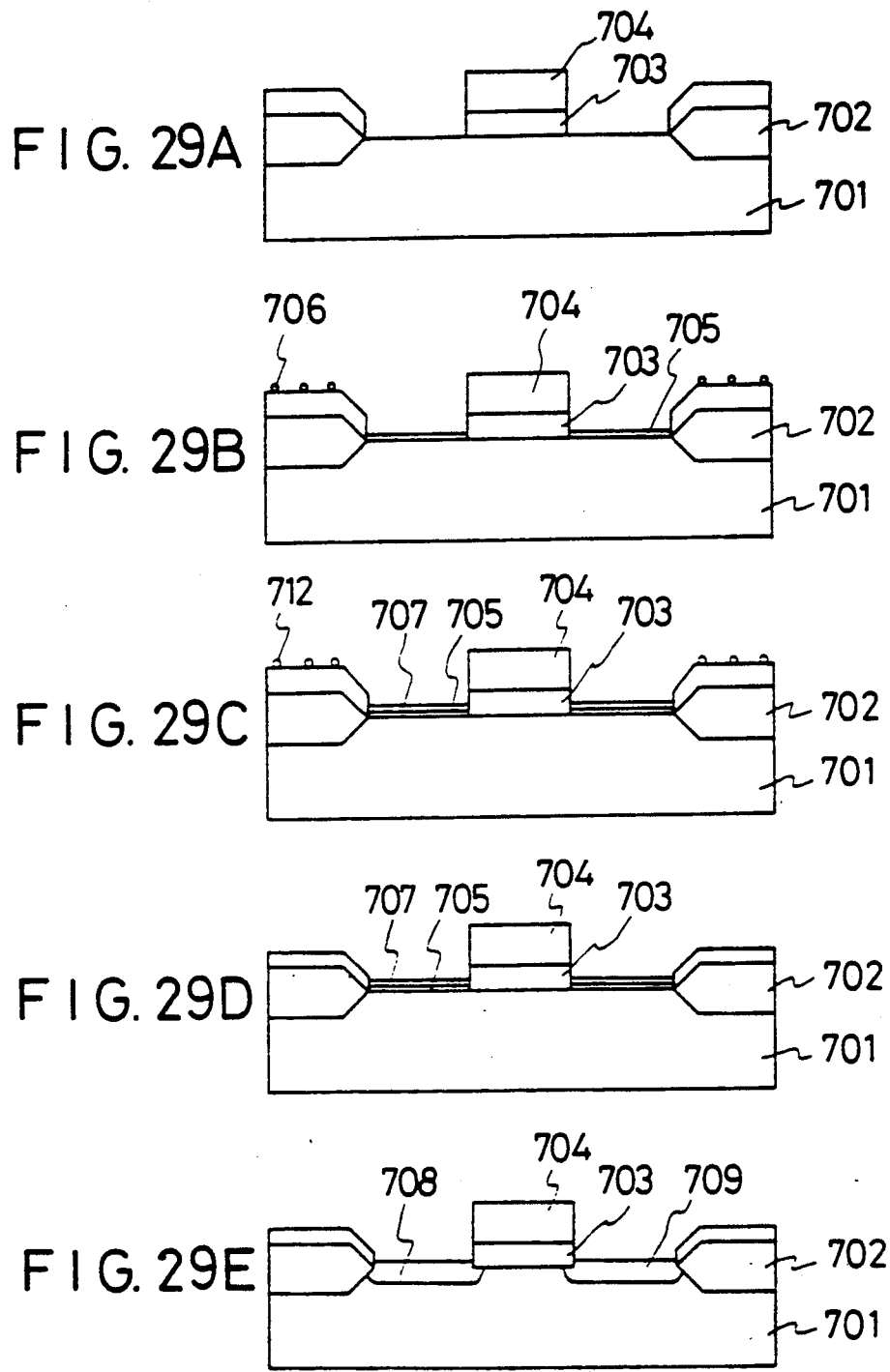
FIGS. 29A-29E are step sequence diagrams showing an eighth embodiment of the inventive method for producing a semiconductor device.

Therefore, according to this embodiment, the FIG. 29C step is added after the FIG. 29B step to etch lightly the field insulating film 702 to remove the boron adsorbed surface portion 706 so as to avoid deposition of polysilicon.

Then in the following FIG. 29D step, a silicon epitaxial layer 707 is formed selectively on the boron adsorption layer, while concurrent deposition of polysilicon can be suppressed on the field insulating layer 702.

Lastly in the FIG. 29E step, thermal treatment is effected at 700° C.–950° C. to form a P+ type source region 708 and a P+ type drain region 709 to thereby produce the P type MOS transistor. In order to increase the amount of boron doping in the P+ type source and drain regions, it can be effective to increase the supply amount of boron-containing gas, or to repeatedly carry out boron adsorption and silicon epitaxy. When repeatedly and successively forming a boron adsorption layer and a silicon epitaxial layer, etching of field insulating film 702 may be undertaken after each formation of a boron adsorption layer or several times intermittently. However, when not effecting the etching after every formation of boron adsorption layer, the etching must be carried out after the last formation of a boron adsorption layer.

FIG. 30 is a process flow chart of the steps of doping the impurity to form the source region 708 and drain region 709. Firstly, the semiconductor substrate 701 is heated at 850° C. in a vacuum of about less than $10^{-4}$ Pa. Next, hydrogen gas is introduced into the chamber at $1.3 \times 10^{-2}$ Pa of vacuum degree for a given interval. The inert film in the form of a natural oxide film less than about 30Å thick is removed by the hydrogen from the surface of silicon substrate 701 to thereby clean the substrate surface. Consequently, activated silicon atoms are exposed on the substrate surface.

Next, a compound gas containing boron, such as diborane gas, is applied to the cleaned surface of the substrate for a given time interval at about $1.3 \times 10^{-1}$ Pa of charging pressure while maintaining the substrate temperature at about 825° C. to thereby form the boron adsorption layer on the silicon substrate 701. Then, the field oxide film 702 is etched by a dry etching or wet etching method &o remove the boron-deposited surface thereof. Subsequently, dichlorsilane and hydrogen are successively introduced to form selectively the silicon epitaxial layer on the boron adsorption layer. The silicon epitaxial layer may be formed by utilizing trichlorosilane gas, silane gas or disilane gas.

Figure 31:
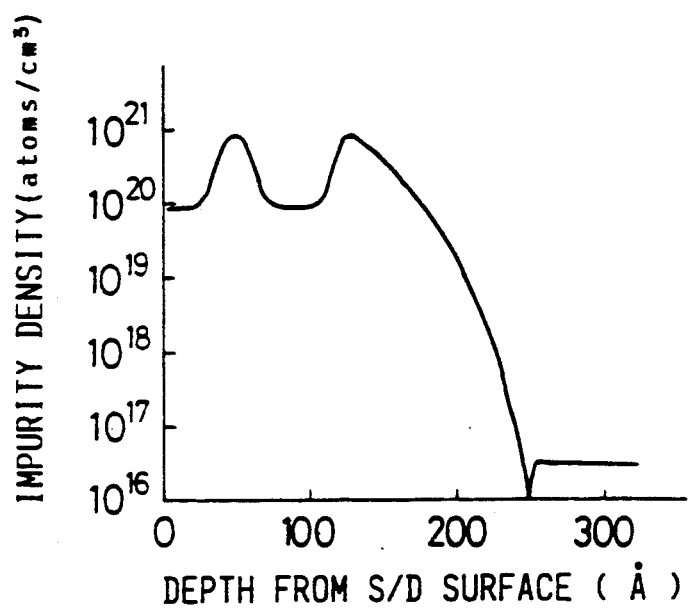
FIG. 31 is a graph showing the depth distribution of the impurity atoms according the eighth embodiment.

FIG. 31 is a depth profile of the boron density obtained by the FIG. 30 process in which boron adsorption is carried out twice. The first and second adsorption layers may contain boron exceeding the solid-solution limit. Boron is captured into the silicon epitaxial layers by thermal diffusion. By increasing the number of boron adsorption layers, a greater amount of boron may be introduced into the silicon substrate.

Next, a modification of the eighth embodiment will be described in conjunction with FIGS. 32A-32E, in which the step sequence is altered in that the etching is carried out after the epitaxy, though the same effect can be obtained in this modification.

In the FIGS. 32A and 32B steps, a boron adsorption layer 705 is formed in a manner similar to the previous embodiment. Then, in the FIG. 32C step, a silicon epitaxial layer 707 is deposited on the boron adsorption layer. At this time, silicon 712 may be deposited concurrently on field insulating film 702 since boron may be lightly adsorbed on the field insulating film 702. Thus, in the FIG. 32D step, dry etching or wet etching is carried out to remove a surface of the field insulating film 702 together with the deposited silicon. When repeatedly carrying out boron adsorption and silicon epitaxy several times, etching may be effected after every formation of an epitaxial layer or may be effected intermittently. However, when not carrying out etching every time, the etching must be undertaken after the formation of the last silicon epitaxial layer. Thereafter in the FIG. 32E step, the thermal treatment is carried out in a manner similar to the previous case to form a P+ type source region 708 and a P+ type drain region 709 to thereby produce a P type MOS transistor. As described above, according to the eighth embodiment, the field insulating film is etched to ensure perfect device isolation.

NINTH EMBODIMENT

The ninth embodiment of producing the MISFET includes the steps of forming on a surface of a first conductivity type of a semiconductor substrate a gate insulating film and an N+ type gate electrode, sequentially. An oxide film layer is formed around the N+ type gate electrode to cover the same. An inert film is removed from a pair of semiconductor surface sections which are spaced from each other by the N+ type gate electrode to expose an active face of the semiconductor substrate. A gas containing a second conductivity type of impurity is applied to the exposed active face to form thereon an impurity adsorption layer containing the impurity element. Then, the impurity is doped into the semiconductor substrate of the first conductivity type from a diffusion source composed of the impurity adsorption layer to thereby form source and drain regions.

According to this embodiment, after the N+ gate electrode is entirely covered by the oxide film layer, the other oxide film is removed from the semiconductor substrate surface to expose the chemically active face. An impurity containing gas such as diborane is applied to the exposed active face to adsorb boron to thereby form the impurity adsorption layer. Subsequently, solid-phase diffusion of the second conductivity impurity is effected into the first conductivity type semiconductor substrate from a diffusion source composed of the impurity adsorption layer to thereby form the source and drain regions. Since the plate electrode is covered by the oxide film layer, impurity doping is selectively effected only into the active silicon face.

Hereinafter, the ninth embodiment is described in detail with reference to FIGS. 33A-33F. In the FIG. 33A step, there is prepared an N type silicon single crystal substrate 801, and a field insulating film 802 is locally formed on a surface of the substrate 801 for device isolation. Thereafter, a gate oxide film 803 of 200Å thickness and an N+ type polysilicon gate electrode 804 of, for example, 3000Å thickness are sequentially formed on the substrate. In the FIG. 33B step, an oxygen gas and a hydrogen gas are concurrently introduced in a reaction chamber while heating the substrate to a temperature of, for example, 800° C. to form an additional oxide film layer 805 by wet oxidation. In this case, the gate electrode 804 is composed of N+ type polysilicon having an oxidation rate at least three times as great as that of the single crystal substrate 801. Therefore, the oxide film layer 805 has a thickness of about 600Å around and over the gate electrode 804, while the oxide film layer 805 has a locally different thickness of about 300Å on other than the gate electrode 804. However, the film thickness of the gate oxide film 803 has the original value of 200Å under the gate electrode 804 except at edge portions thereof since the gate oxide film 803 is partly masked by the gate electrode 804.

Figure 33A:
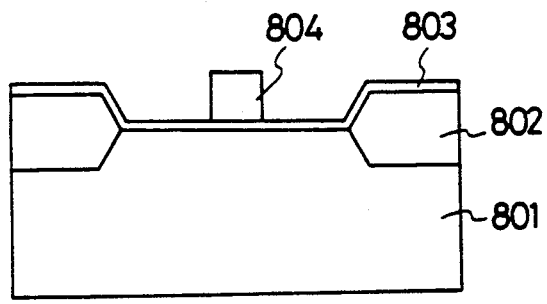
FIGS. 33A-33E are step sequence diagrams showing a ninth embodiment of the inventive method for producing a semiconductor device.
Figure 33D:
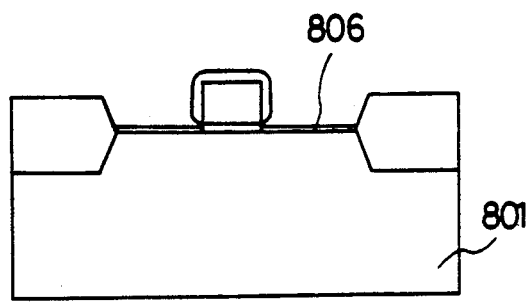
Figure 33B:
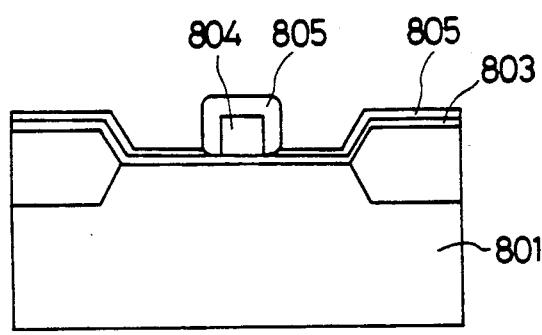
Figure 33E:
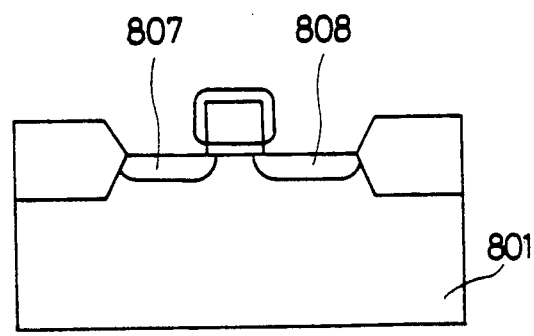
Figure 33C:
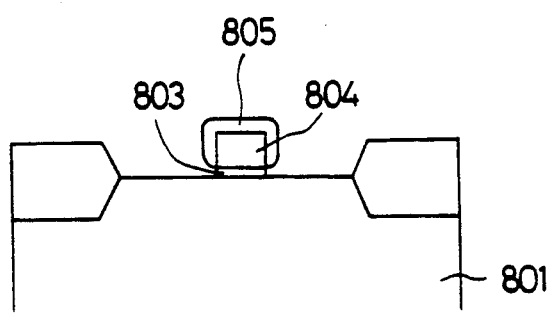
Figure 34A:
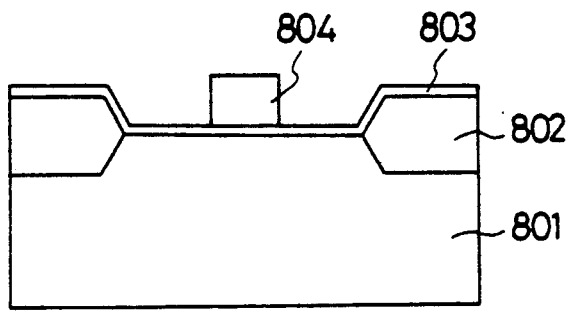
Figure 34D:
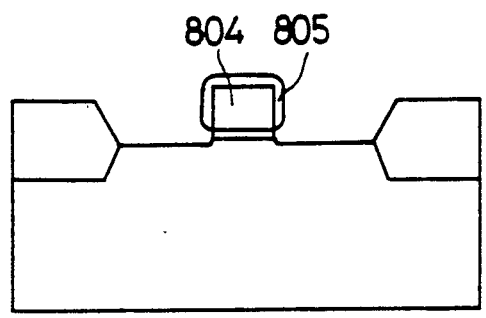
Figure 34B:
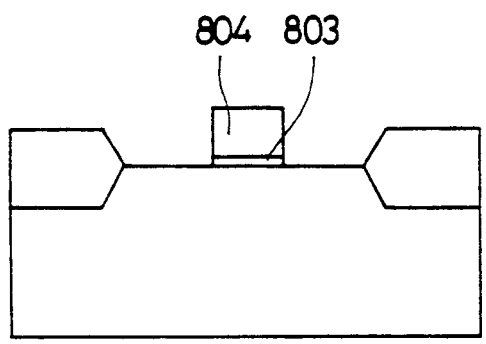
Figure 34E:
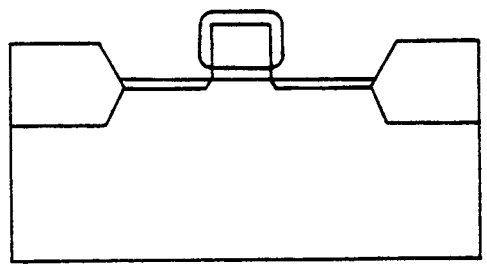
Figure 34C:
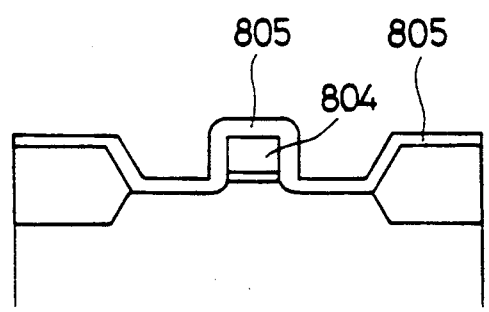
Figure 34D:
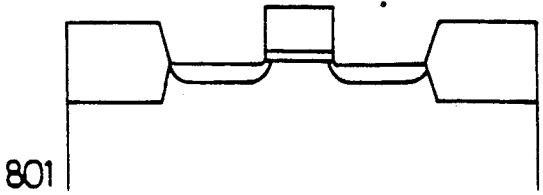

In the FIG. 33C step, the oxide films are etched away by a thickness of at least 350Å throughout the substrate surface. In this embodiment, the etching condition is just set so as to leave 250Å of oxide film 805 around the gate electrode 804 including the side wall and top face thereof, and concurrently to leave 200Å of the gate oxide film 803 at the location under gate electrode 804, while the gate oxide film is completely removed from the remaining area of the substrate. However, after finishing regular chemical etching of the oxide film, the substrate 801 is still covered with a quite thin natural oxide film less than about 30 Å thick.

In the FIG. 33D step, the natural oxide film is removed from the substrate 801, and an adsorption layer 806 of P type impurity element is formed on the substrate. This step is essential to the invention and therefore described in detail. The natural oxide film is removed by heating the substrate 801 while it is at 850° C. and held at a vacuum pressure of less than $1 \times 10^{-4}$ Pa. Concurrent introduction of hydrogen gas may facilitate the removal of the natural oxide film.

Thereafter, diborane gas ($B_2H_6$) is applied to the activated face of the substrate 801. In this embodiment, the diborane gas is diluted to a concentration of 5% with nitrogen gas $N_2$. At this stage, the substrate 801 is heated at 800° C. and the diborane gas is introduced for 100 seconds at $3 \times 10^{-2}$ Pa of gas pressure. Consequently, there is formed on the active face of the substrate 801 an impurity adsorption layer 806 having a high boron concentration or being composed of substantially 100% boron. This P type impurity adsorption layer is firmly bonded to the active face and a part of the boron may be diffused into the substrate to form the stable impurity diffusion region since the substrate is heated. The impurity adsorption layer, including the diffusion region, has a thickness of about 300Å, including the diffusion region.

In the FIG. 33E step, after formation of the impurity adsorption layer 806, a heating treatment is undertaken for 30 minutes at a substrate temperature of 900° C. to effect diffusion of boron into the silicon bulk from the impurity adsorption layer 806 and activation of boron to thereby form a source region 807 and a drain region 808. This heating treatment may be substituted by other thermal treatment such as a reflow process of interlayer insulating film though not shown in the FIGS. 33A-33E steps. The thus obtained source region 807 and drain region 808 have a PN junction depth of less than $0.1\mu$.

FIGS. 34A-34F show a modification of the ninth embodiment of producing the semiconductor device. The FIG. 34A step is identical to the FIG. 33A step. In the FIG. 34B step, a gate insulating film 803 is removed by etching except under a gate electrode 804. In the FIG. 34C step, a thermal oxidation process is effected in a manner similar to the preceding embodiment so that an oxide film 805 is formed to a thickness of 150Å on a substrate 801 and to a thickness of 600Å around gate electrode 804 to cover the side wall and top face thereof. Thereafter, in the FIG. 34D step, the oxide film is etched in manner similar to the FIG. 33C step. In this modification, the etching may be carried out to just remove a 150Å thick layer of the oxide film so that a thickness of 450Å of the oxide film 805 remains around the gate electrode 804. Therefore, a thicker oxide film can be left around the gate electrode 804 as compared to the preceding case.

According to the ninth embodiment, doping is effected based on the chemical adsorption of an impurity element to selectively introduce the impurity into the active silicon surface while the gate electrode is masked by the oxide film formed therearound. Consequently, source and drain regions are formed in self-alignment relative to the gate electrode. By such production method, the semiconductor device structurally features a shallow junction depth of the source and drain regions, and no damage at edge portions of the gate insulating film. Accordingly, as compared to the prior art, the channel length can be reduced while effectively avoiding punch through and the short channel effect, thereby achieving further size reductions for the semiconductor device.

TENTH EMBODIMENT

The tenth embodiment of the inventive method for producing the MISFET is comprised of the first step of forming sequentially a field oxide film, a gate insulating film and a gate electrode on a surface of a semiconductor substrate of a first conductivity type, the second step of deeply etching a pair of surface sections separated from each other by the gate electrode, the third step of removing an inert film from an etched surface of the semiconductor substrate to expose an active face, the fourth step of applying to the active face a gas containing impurity of a second conductivity type to form an impurity adsorption layer, and the fifth step of effecting solid-phase diffusion of the impurity from a diffusion source composed of the impurity adsorption layer into the semiconductor substrate of the first conductivity type to form a source region and a drain region.

Preferably, in the second step, a pair of planar sections divided by the gate electrode are etched along with the gate electrode, the etched sections and gate electrode are oxidized to form an oxide film layer, and thereafter the oxide film layer is selectively left around the gate elcctrode effective to avoid doping of boron into the gate electrode.

Preferably in the fourth step, the active face is contacted with a gas mixture containing a semiconductor component and an impurity component of the second conductivity type to form an adsorption layer containing the semiconductor component and the impurity component.

Preferably after the fourth step, an epitaxial growth may be carried out to form a second semiconductor layer on the impurity adsorption layer to facilitate activation of the impurity such as boron.

The MISFET produced by the above method is comprised of an N type silicon semiconductor substrate, a gate insulating film formed on a part of the semiconductor substrate surface, an N+ type gate electrode formed on the gate insulating film, and a pair of source and drain regions separated by the gate electrode and formed below the surface level of the semiconductor substrate under the gate electrode.

According to this embodiment, a field oxide film, a gate insulating film and a gate electrode are sequentially formed on a semiconductor substrate of the first conductivity type. Thereafter, a pair of separated planar sections are isotropically etched to define hollow source and drain regions. Then, an oxide film is removed from the semiconductor substrate surface to expose a chemically active face. The exposed active face is contacted with a gas containing an impurity such as diborane to form an impurity adsorption layer of P type. This adsorption is undertaken by heating the substrate so that an extremely stable and thin P type impurity adsorption layer is formed. The thickness of the adsorption layer is optimally set by adjusting the vapor pressure of the applied gas and the application time interval or selecting the substrate temperature. Subsequently, solid-phase diffusion of the impurity is carried out into the semiconductor substrate of the first conductivity type from a diffusion source composed of the impurity adsorption layer to thereby form the source and drain regions.

FIGS. 35A-35F show a step sequence of the tenth embodiment. In the FIG. 35A step, a field oxide film 902 is formed by selective oxidation on a surface of a semiconductor substrate 901, then a gate oxide film 903 is formed, and thereafter a polysilicon film 904 is deposited on the gate oxide film. Predeposition diffusion of phosphorus is carried out using $POCl_3$ to turn the neutral polysilicon into N+ polysilicon. In the next step shown in FIG. 35B, the N+ polysilicon film 904 is patterned to form a gate electrode 905. In the FIG. 35C step, gate oxide film 903 is removed from the substrate surface except under gate electrode 905 as pretreatment for the following anisotropic etching. In the FIG. 35D step, the substrate is etched isotropically to a depth of 200Å to define a source region and a drain region. In this embodiment, a reactive ion etching apparatus is utilized and employs an etching gas composed of chlorine ($Cl_2$) to effect selective etching of the substrate. The monocrystalline silicon of substrate 901 has an etching rate several times as great as that of silicon oxide so that the etching of the field oxide film does not cause serious problems in view of its sufficient thickness. After this etching, a natural oxide film 911 is formed on the silicon surface.

Figure 35A:
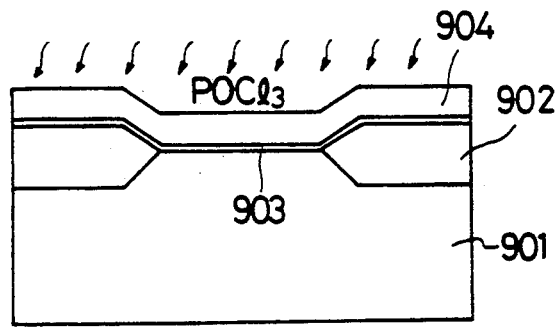
FIGS. 35A-35F are step sequence diagrams showing a tenth embodiment of the inventive method for producing a semiconductor device.
Figure 35B:
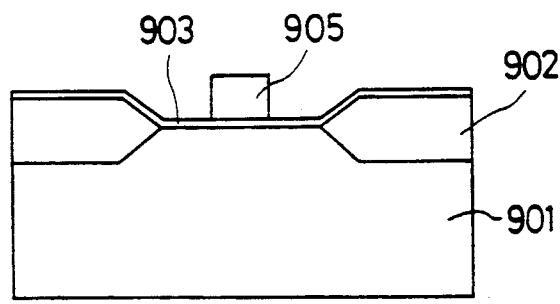
Figure 35C:
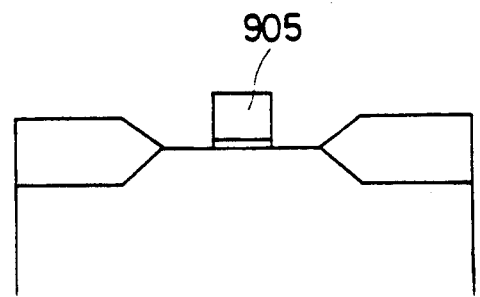
Figure 35D:
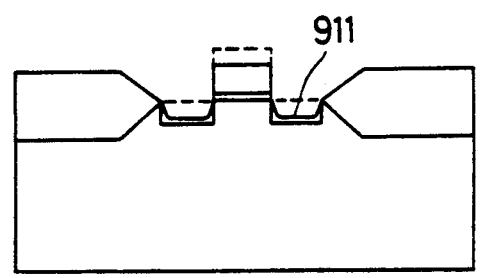
Figure 35E:
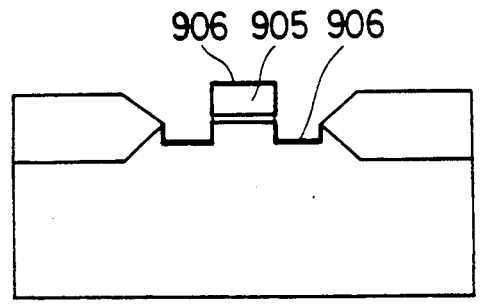

In the FIG. 35E step, the natural oxide film 911 is removed from the substrate, and an adsorption layer 906 of P type impurity element is formed on the etched part of the substrate. This step is essential to the invention and therefore described in detail. After the FIG. 35D step, the natural oxide film is removed by heating the washed substrate at 850° C. while it is held at a vacuum pressure of less than $1 \times 10^{-4}$ Pa. Concurrent introduction of hydrogen gas may facilitate the removal of natural oxide film by reduction. Thereafter, diborane gas ($B_2H_6$) is applied to the activated face of the substrate. At this stage, the substrate is heated at 800° C. and the diborane gas is introduced for a given interval at $4.0 \times 10^{-2}$ Pa of gas pressure. Consequently, the etched face of the substrate and the etched face of the gate electrode 905 have formed thereon an impurity adsorption layer 906 containing boron.

According to the inventors' detailed study, it has been found that the impurity adsorption layer is substantially not deposited on an inert film such as a natural oxide film. Even though a slight amount of boron is deposited on the inert film, the deposited boron remains on the inert film at least one order less than that on the active face after the following thermal treatment including annealing.

Figure 35F:
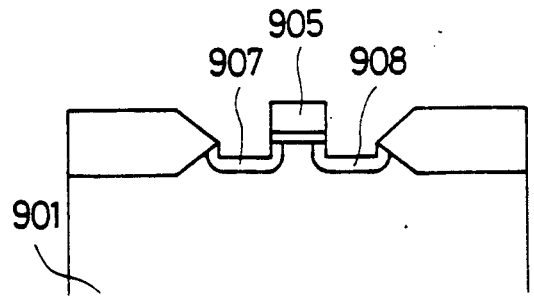

In the FIG. 35F step, the impurity contained in the adsorption layer 906 is solid-phase-diffused into the semiconductor substrate 901 to form an impurity-diffused layer in the form of a source region 907 and a drain region 908. In this step, concurrently, the impurity is solid phase-diffused into the gate electrode 905 from the impurity adsorption layer 906 formed on the etched or exposed part of the gate electrode 905. However, the gate electrode has been provisionally doped with an excess amount of phosphorus so that the added boron of the second conductivity type is neutralized with phosphorus of the first conductivity type. Consequently, the gate electrode remains of the N+ type. The thus obtained semiconductor device has source and drain regions of relatively large effective area, effective to reduce contact resistance.

FIGS. 36A-36E show a modification of the tenth embodiment, in which boron doping into the gate electrode is blocked and an oxide film is provided over the gate electrode to avoid electrical shorting between the ga&:e electrode and the source / drain regions. The FIG. 36A step is carried out in a manner identical to the FIG. 35C step. Then, in the FIG. 36B step, an oxide film layer 909 is formed by a wet oxidation method. In this process, the polysilicon gate electrode 905 has been doped with a high density of phosphorus such that its oxidation rate is at least three times as great as that of the silicon substrate 901. Therefore, for example, the oxide film thickness is 400Å over the polysilicon gate electrode 905, while the oxide film thickness is about 100Å over the silicon substrate 901. At the end of the FIG. 36B step, the oxide film is etched to remove it entirely at least from the semiconductor surface 901. After etching, the oxide film layer 909 still remains over the polysilicon gate electrode 905.

Figure 36A:
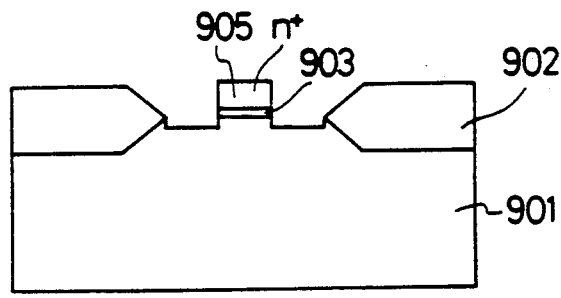
FIGS. 36A-36E are step sequence diagrams showing a modification of the tenth embodiment.
Figure 36D:
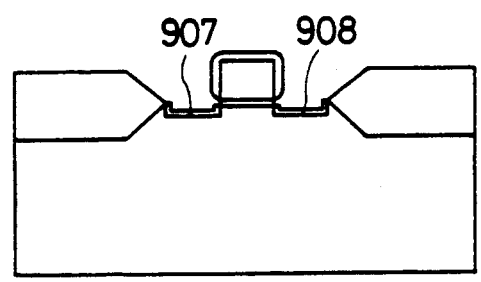
Figure 36B:
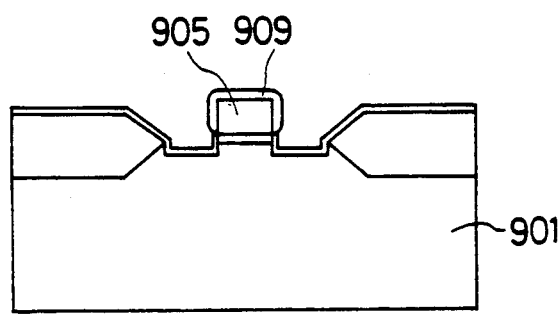
Figure 36E:
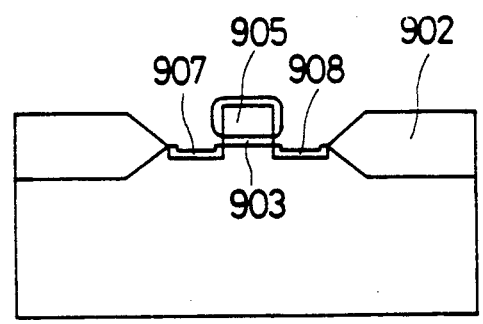
Figure 36C:
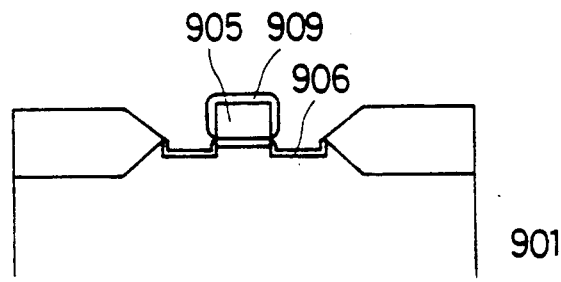

In the following FIG. 36C step, diborane gas is applied to the exposed and activated surface of the substrate 901 to form a boron adsorption layer 906 in a manner similar to the FIG. 35E step. In this modification, the gate electrode 905 is covered with the oxide film layer 909 as a mask so that the diffusion of boron into the gate electrode 905 is suppressed. Further, in the FIG. 36D step, annealing is carried out to form a source region 907 and a drain region 908. Lastly in the FIG. 36E step, selective epitaxy is undertaken over the substrate by a reduced pressure epitaxial growth method, using a gas mixture of dichlorosilane ($SiH_2Cl_2$) and hydrogen ($H_2$), to form an epitaxial layer only on the boron adsorption layer in the source region 907 and the drain region 908, because the epitaxial layer could not be formed on the field oxide layer 902, the gate oxide film 903, or the gate electrode 905 covered by the oxide film as a mask. The silicon epitaxial layer is provided on the boron adsorption layer 906 so as to facilitate activation of boron. Instead of superposing the silicon epitaxial layer on the boron adsorption layer, doped-epitaxy may be carried out such that diborane and dichlorosilane containing the semiconductor component Si are concurrently applied to the active face of the silicon substrate to form an adsorption layer containing boron and silicon. Then, solid-phase diffusion of boron is effected into the substrate from a diffusion source composed of this adsorption layer to form a source region and a drain region to thereby activate boron.

Generally, when forming a P type adsorption film, the treatment chamber is charged with a gas containing P type element, such as diborane ($B_2H_6$), trichlorotoron ($BCl_3$) and trifluoroboron ($BF_3$). On the other hand, when forming the N type adsorption film, the chamber is charged with a gas containing N type element, such as arsine ($AsH_3$), phosphine ($PH_3$), phosphorus trichloride ($PCl_3$), arsenic trifluoride ($AsF_3$) or phosphorus pentafluoride ($PF_3$).

ELEVENTH EMBODIMENT

Lastly, the eleventh embodiment of the inventive method for producing a semiconductor device relates to a process of forming a metal silicide layer over the source region, drain region and gate electrode in the MISFET. In this embodiment, before or after depositing metal over the source region, drain region and gate electrode, an impurity adsorption layer containing the dominant impurity of the source region, drain region and gate electrode is formed so as to reduce resistivity of the source region, drain region and gate electrode. Further, the source and drain regions are given an ultra-shallow junction depth, thereby obtaining the semiconductor device having fast signal transfer speed and very small size.

According to the present embodiment, before or after depositing metal over the source region, drain region and gate electrode, the impurity adsorption layer is formed and then a thermal process is effected to form a metal silicide layer over the source region, drain region and gate electrode. Concurrently, the shallow source region and drain region are formed in the silicon substrate surface. Further, a polysilicon layer is processed to form the gate electrode containing impurity of the same type as that of the source and drain regions. By such construction, the thus obtained semiconductor device has a small size, fast operation speed and stable threshold voltage not affected by variation of the channel length.

The eleventh embodiment is described in detail with step sequence diagrams of FIG. 37A–37D. In the FIG. 37A step, there is provided a semiconductor structure having an N type silicon substrate 1011 or N well containing N type impurity, a gate insulating film 1012, a polysilicon gate electrode 1013, an insulating side wall film spacer 1014 formed at opposite sides of the gate electrode, and a boron adsorption layer 1015 of P type impurity.

Figure 37A:
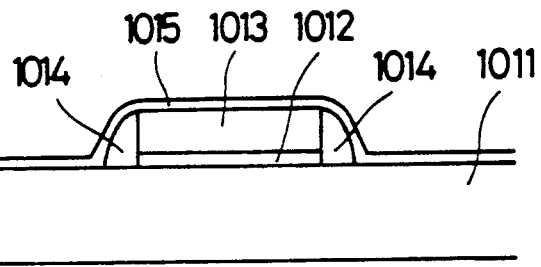
FIGS. 37A-37D are step sequence diagrams showing an eleventh embodiment of the inventive method for producing a semiconductor device.
Figure 37B:
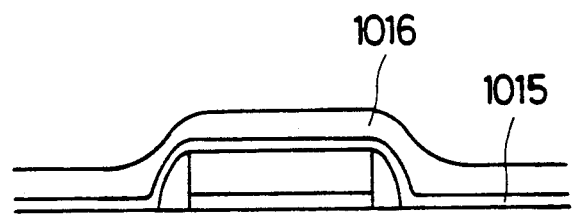
Figure 37C:
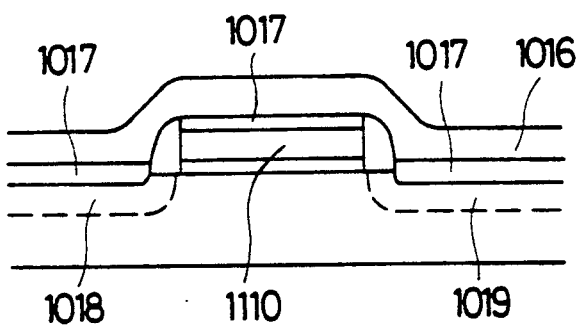

In the FIG. 37B step, a metal film, for example a Ti film, 1016 is deposited on the boron adsorption layer 1015. In the next FIG. 37C step, annealing is carried out at a relatively low temperature of about 700° C. to form a metal silicide layer 1017 over the source region 1018, drain region 1019 and gate electrode 1013. Concurrently, boron is slightly diffused into the silicon bulk from the boron adsorption layer 1015 to form the quite shallow source region 1018 and drain region 1019. Further, boron is also diffused from the adsorption layer into the polysilicon film which constitutes the gate electrode so as to form the doped polysilicon layer 1110 containing P type impurity boron.

Figure 37D:
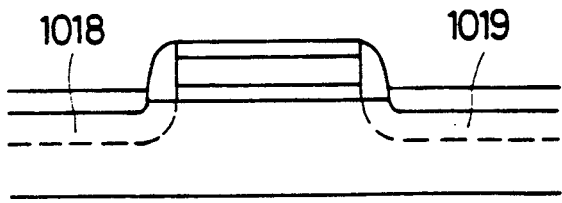

In the FIG. 37D step, the metal (Ti) film 1016 is etched away and thermal treatment is carried out at about 900° C. to activate the metal silicide in the source region, the drain region and the gate electrode to reduce their resistivity. After this annealing, the source region and drain region are provided with an ultrashallow junction.

FIGS. 38A–38D show a modification of the eleventh embodiment. In the FIG. 38A step, there is prepared a semiconductor structure having an N type silicon substrate 1031 or N well containing N type impurity, a gate insulating film 1032, a polysilicon gate electrode 1033, an insulating side wall film spacer 1034 formed on opposite sides of the gate electrode, and a deposited metal film 1035 composed of, for example, Ti. In the FIG. 38B step, annealing is carried out at a relatively low temperature of 900° C. to form a metal silicide layer 1036 over the source region, drain region and gate electrode.

Figure 38A:
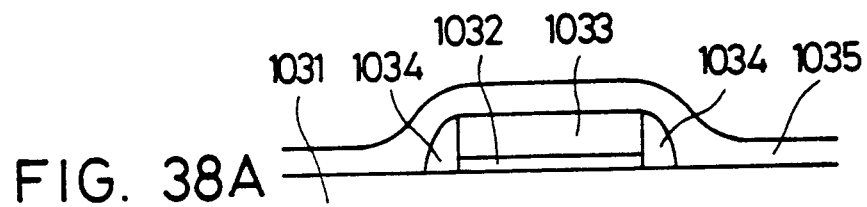
FIGS. 38A-38D are step sequence diagrams showing a modification of the eleventh embodiment.
Figure 38B:
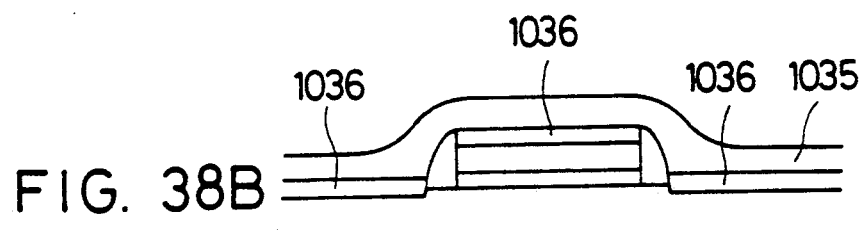
Figure 38C:
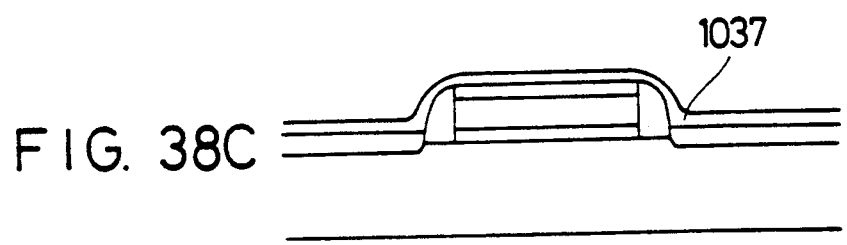
Figure 38D:
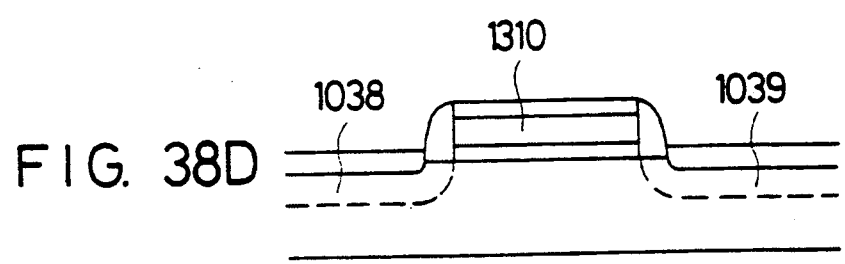

In the FIG. 38C step, the metal film 1035 is etched away and a boron adsorption layer 1037 is formed over the source region, drain region and gate electrode. Then in the FIG. 38D step, another annealing is carried out at about 900° C. to form a P type impurity region having an ultrashallow junction in the source region 1038 and the drain region 1039. Moreover, under the metal silicide layer, the polysilicon layer of the gate electrode is converted into the P type polysilicon layer 1310.

As described above, according to the eleventh embodiment in which a metal silicide is formed over the surface of the source region, drain region and gate electrode, the source and drain regions have an ultrashallow junction depth and no defects, thereby providing a transistor of quite small size and fast operation speed. Further, the gate electrode can be formed of polysilicon containing an impurity of the same conductivity type as that doped into the source and drain regions, thereby providing an MIS transistor having a substantially constant threshold voltage not affected by the variation of channel length.

As described in conjunction with the various embodiments, according to the inventive method, an impurity adsorption layer is formed on an activated face of the semiconductor so as to provide a shallow PN junction in source and drain regions of a MISFET, thereby producing effectively the improved semiconductor device having a reduced size and a faster operation speed.

This application relates to subject matter disclosed in Japanese Application nos. 1-209287, filed on Aug. 11, 1989; 1-209288, filed on Aug. 11, 1989; 1-209289, filed on Aug. 11, 1989; 1-209291, filed on Aug. 11, 1989; 1-203192, filed on Aug. 18, 1989; 1-231276, filed on Sept. 6, 1989; 1-231277, filed on Sept. 6, 1989; 1-231279, filed on Sept. 6, 1989; 1-231280, filed on Sept. 6, 1989; 1-318557, Dec. 6, 1989; 1-86680, filed on Jul. 18, 1989; and 1-86682, filed on Jul. 18, 1989, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing an insulated gate field effect transistor comprising:
   a) sequentially forming a gate insulating film and a gate electrode on a semiconductor region of a first conductivity type, the semiconductor region having two sections separated from one another by the gate electrode;
   b) etching a part of the gate insulating film to expose the two sections;
   c) removing an inert film disposed on the two sections of the semiconductor region by a procedure which includes at least one of a reduction reaction and a heat treatment to expose active surfaces;
   d) applying to the active surface a gas containing an impurity component of a second conductivity type opposite to the first conductivity type to form a diffusion source composed of an impurity adsorption layer containing impurity atoms; and
   e) introducing the impurity atoms into the semiconductor region of the first conductivity type from the diffusion source to thereby form source and drain regions of the second conductivity type at the two sections.

2. A method according to claim 1 wherein said step b) comprises etching the gate insulating film and the semiconductor region within the two sections separated from one another by the gate electrode.

3. A method according to claim 1 wherein said step b) includes etching concurrently the two sections of the semiconductor region and the gate electrode, oxidizing at least part the etched surface of the semiconductor region and the gate electrode to form an oxide film, and leaving a part of the oxide film over the gate electrode to surround the gate electrode.

4. A method according to claim 1 wherein said step d) comprises applying to the active surfaces a gas containing a semiconductor component and another gas containing the impurity component of the second conductivity type to incorporate the semiconductor component and the impurity component in the impurity adsorption layer.

5. A method according to claim 1 wherein said step d) forming a semiconductor epitaxial layer on the impurity adsorption layer.

6. A method according to claim 1 wherein said step d) includes forming a semiconductor epitaxial layer on the adsorption layer, and forming an insulating layer on the semiconductor epitaxial layer.

7. A method according to claim 7 wherein said step e) comprises diffusing and activating the impurity by either of ramp anneal and radiation beam anneal.

8. A method according to claim 7 wherein said steps d) and e) are carried out repeatedly at least twice.

9. A method according to claim 1 wherein said step comprises applying to an active face of the semiconductor substrate of the first conductivity type composed of an N type silicon substrate a diborane gas containing boron of P type impurity while heating the substrate to thereby form a boron adsorption layer.

10. A method according to claim 1 wherein said step b) comprises selectively etching the gate insulating film through a mask composed of the gate electrode to expose the surface of the semiconductor region of the first conductivity type at the two sections.

11. A method according to claim 10 wherein the gate electrode is an N+ type gate electrode and further comprising steps a) and b), forming an oxide to surround and cover the gate electrode.

12. A method according to claim 11 wherein said step a) comprises forming locally a field insulating film on a surface of a semiconductor substrate of the first conductivity type to define a device region and an isolation region, forming sequentially the gate insulating film and a polysilicon film on the semiconductor substrate formed with the field insulating film, doping the polysilicon film with an impurity, and patterning the impurity-doped polysilicon film to form the N+ type gate electrode in the device region.

13. A method according to claim 12 wherein said step b) comprises thermally oxidizing concurrently the device region formed with the insulating film and the isolation region to form an oxide layer, and thereafter removing the oxide film from the two sections separated from one another by the N+ type gate electrode within the device region.

14. A method according to claim 12 wherein said step b) comprises removing the insulating film selectively from the two sections separated from one another by the N+ type gate electrode within the device region, then forming an oxide film over the device region and isolation region by thermal oxidation, and thereafter removing selectively a part of the oxide film from the two sections separated from one another by the N+ type gate electrode.

15. A method according to claim 12 wherein said step d) comprises applying to the active surfaces semiconductor region, a diborane gas containing an impurity component of boron to form an impurity adsorption layer composed of boron.

16. A method according to claim 10 wherein said step a) comprises forming sequentially a field insulating film, the gate insulating film and the gate electrode on a surface of the semiconductor region of the first conductivity type, and wherein said step d) comprises forming the impurity adsorption layer on the active surface exposed on the surface of the semiconductor region, etching away a surface portion of the field insulating film, and thereafter forming a semiconductor epitaxial layer on the impurity adsorption layer.

17. A method of producing a semiconductor device comprising:
a) sequentially forming a gate insulating film and a gate electrode on a semiconductor region of a first conductivity type, the semiconductor region having two sections separated from one other by the gate electrode;
b) removing an inert film disposed on the two sections by a procedure which includes at least one of a reduction reaction and a heat treatment to expose active surfaces;
c) forming an insulating film spacer on opposite sides of the gate electrode;
d) applying to the active surfaces and a surface of the gate electrode a gas containing an impurity component of a second conductivity type opposite to the first conductivity type to form an impurity adsorption layer containing impurity atoms;
e) depositing a metal film on the impurity adsorption layer and then heating the metal film to form a metal silicide layer on the gate electrode and a source region and a drain region at the two sections separated from one another by the gate electrode;
f) etching away the metal film over the metal silicide; and
g) effecting thermal treatment to activate the metal silicide formed on the source region, drain region and gate electrode.

18. A method of producing an insulated gate field effect transistor comprising:
a) sequentially forming a gate insulating film and a gate electrode on a semiconductor region of a first conductivity type, the semiconductor region having two sections separated from one another by the gate electrode;
b) etching a part of the gate insulating film to expose the two sections;
c) removing an inert film disposed on the two sections of the semiconductor region to expose active surfaces;
d) forming an epitaxial layer on the active surfaces, and then applying to the epitaxial layer a gas containing an impurity component of a second conductivity type opposite to the first conductivity type to form a diffusion source composed on an impurity adsorption layer containing impurity atoms; and
e) introducing the impurity atoms into the epitaxial layer from the diffusion source to thereby form source and drain regions of the second conductivity type at the two sections.

19. A method of producing an insulated gate field effect transistor comprising:
a) sequentially forming a gate insulating film and a gate electrode on a semiconductor region of a first conductivity type, the semiconductor region having two sections separated from one another by the gate electrode;
b) etching a part of the gate insulating film to expose the two sections;
c) removing an inert film disposed on the two sections of the semiconductor region to expose active surfaces;
d) forming a plurality of individual semiconductor epitaxial layers on the active surfaces and applying a gas containing an impurity component of a second conductivity type opposite the first conductivity type to form a plurality of diffusion sources each composed of an impurity adsorption layer containing impurity atoms, the impurity adsorption layers alternating with the individual semiconductor epitaxial layers so that the impurity adsorption layers and the epitaxial layers are superposed on one another; and e) introducing the impurity atoms into the individual semiconductor epitaxial layers from the diffusion sources constituted by the impurity adsorption layers to thereby form source and drain regions of the second conductivity types at the two sections.

20. A method of producing a semiconductor device, comprising:
   a) sequentially forming agate insulating film and a gate electrode on a surface of a semiconductor region of a first conductivity type, the semiconductor region having two sections separated from one another by the gate electrode and having active surfaces;
   b) forming an insulating film spacer on opposite sides of the gate electrode;
   c) depositing a metal film on the active surface of the semiconductor region and on the gate electrode, and thereafter heating the metal film to form a metal silicide layer on the gate electrode and on the two sections;
   d) etching away the metal film on the metal silicide layer;
   e) removing an inert film from the etched surface of the metal silicide layer by a procedure which includes at least one of a reduction reaction and a heat treatment to expose an active surface of the silicide layer;
   f) applying to the active face a gas containing an impurity component of a second conductivity type to form an adsorption layer composed of the adsorbed impurity; and
   g) introducing the impurity component into the semiconductor region of the first conductivity type from a diffusion source composed of the impurity adsorption layer to form source and drain regions of a second conductivity type.

* * * * *